United States Patent
Lee et al.

(10) Patent No.: US 9,349,776 B2
(45) Date of Patent: May 24, 2016

(54) ORGANIC LIGHT-EMITTING DISPLAY APPARATUS

(71) Applicant: SAMSUNG DISPLAY CO., LTD., Yongin, Gyeonggi-Do (KR)

(72) Inventors: Jae-Sic Lee, Yongin (KR); Ji-Hye Kim, Yongin (KR); Dong-Wook Kim, Yongin (KR); Tae-Gon Kim, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/445,286

(22) Filed: Jul. 29, 2014

(65) Prior Publication Data

US 2015/0102312 A1 Apr. 16, 2015

(30) Foreign Application Priority Data

Oct. 16, 2013 (KR) .................. 10-2013-0123598

(51) Int. Cl.
*H01L 23/48* (2006.01)
*H01L 27/32* (2006.01)
*G09G 3/32* (2006.01)

(52) U.S. Cl.
CPC .......... *H01L 27/3223* (2013.01); *G09G 3/3233* (2013.01); *H01L 27/3276* (2013.01); *G09G 2300/0413* (2013.01); *G09G 2300/0842* (2013.01); *G09G 2330/08* (2013.01); *G09G 2330/10* (2013.01); *H01L 2251/568* (2013.01)

(58) Field of Classification Search
CPC .......... H01L 27/32; H01L 23/48; G09G 3/32
USPC .............. 257/40, 59, 72; 345/76, 82, 51
See application file for complete search history.

(56) References Cited

U.S. PATENT DOCUMENTS

| 6,100,948 | A | 8/2000 | Kim et al. | |
|---|---|---|---|---|
| 7,573,443 | B2 * | 8/2009 | Oh | ................. 345/76 |
| 2001/0050730 | A1 * | 12/2001 | Tsukao | .......................... 349/54 |
| 2006/0195736 | A1 * | 8/2006 | Hayashi | ....................... 714/724 |
| 2007/0095639 | A1 * | 5/2007 | Kim et al. | ..................... 200/310 |
| 2009/0102829 | A1 * | 4/2009 | Abe et al. | ...................... 345/214 |
| 2012/0056186 | A1 * | 3/2012 | Shirouzu | ........................ 257/59 |
| 2013/0083612 | A1 | 4/2013 | Son et al. | |

FOREIGN PATENT DOCUMENTS

| JP | 2003-050400 | | 2/2003 |
|---|---|---|---|
| JP | 2007-316511 | A | 12/2007 |
| KR | 1997-0028986 | | 6/1997 |
| KR | 10-0666639 | B1 | 1/2007 |
| KR | 10-2008-0024009 | A | 3/2008 |
| KR | 10-2013-0035845 | A | 4/2013 |

* cited by examiner

*Primary Examiner* — Sheng Zhu
(74) *Attorney, Agent, or Firm* — Lee & Morse, P.C.

(57) ABSTRACT

A display apparatus includes an array of pixels and dummy pixels. A plurality of first lines are connected to the pixels and the dummy pixels. A plurality of repair lines are connected to the dummy pixels and are selectively connected to the pixels. A plurality of second lines are connected to the pixels. At least one dummy line is connected to the dummy pixels. At least one dummy wiring is connected to the at least one dummy line and is selectively connected to one of the second lines.

20 Claims, 14 Drawing Sheets

ORGANIC LIGHT-EMITTING DISPLAY APPARATUS

CROSS-REFERENCE TO RELATED APPLICATION

Korean Patent Application No. 10-2013-0123598, filed on Oct. 16, 2013, and entitled, "Organic Light-Emitting Display Apparatus," is incorporated by reference herein in its entirety.

BACKGROUND

1. Field

One or more embodiments herein relate to an organic light-emitting display.

2. Description of the Related Art

When a certain pixel is defective, the pixel may always emit light or may never emit light irrespective of the scan and data signals it receives. Such a pixel may be identified as a bright spot or a dark spot. A bright spot is highly visible and therefore easily identifiable by a viewer. Attempts have been made to repair defective pixels using dummy pixels. However, these approaches require additional memory and timing circuits to drive the dummy pixels.

SUMMARY

In accordance with one embodiment, an organic light-emitting display apparatus includes a plurality of pixels arrayed in a first direction and a second direction in an active area; a plurality of dummy pixels arrayed in the second direction in a dummy area; a plurality of first lines which extend in the first direction and are connected to the pixels and the dummy pixels; a plurality of repair lines which extend in the first direction, are connected to the dummy pixels, and are selectively connected to the pixels; a plurality of second lines which extend in the second direction and are connected to the pixels; at least one dummy line which extends in the second direction and is connected to the dummy pixels; and at least one dummy wiring which extends in the first direction, is connected to the at least one dummy line, and is selectively connected to one of the second lines.

Each of the pixels may include a light emitting device and a pixel circuit that is separably connected to the light emitting device, and each of the dummy pixels may include a dummy pixel circuit. When at least one of the pixels is defective, a light emitting device of the at least one defective pixel may be connected to a corresponding one of the dummy pixels via a corresponding one of the repair lines, and may be electrically separated from a pixel circuit of the at least one defective pixel. One of the second lines connected to the at least one defective pixel may be connected to the at least one dummy wiring.

The pixel circuit may include a first transistor to transfer a data signal in response to a scan signal; a capacitor to charge a voltage that corresponds to the data signal; and a second transistor to transfer driving current, that corresponds to the voltage charged in the capacitor, to the light emitting device.

Each of the first lines may be a scan line that transfers the scan signal to the pixel circuit, and each of the plurality of second lines may be a data line that transfers a corresponding data signal to the pixel circuit. Each of the first lines may be a data line that transfers a corresponding data signal to the pixel circuit, and each of the second lines may be a scan line that transfers the scan signal to the pixel circuit.

The at least one dummy wiring may be in an outer region of the active area and the dummy area. The at least one dummy wiring may include a material with lower resistivity than a material of the first lines and a material of the second lines.

A plurality of compensation capacitors may be connected to respective ones of the second lines. When at least one of the pixels is defective, a second line connected to the at least one defective pixel may be electrically separated from a corresponding one of the compensation capacitors.

The compensation capacitors may include a plurality of first electrodes connected to respective ones of the second lines and a plurality of second electrodes that are commonly connected, the second electrodes may be connected to an external terminal through which an external signal is to be input.

The dummy area may include a first dummy area and a second dummy area, the active area may be between the first and second dummy areas and includes a first active area adjacent the first dummy area and a second active area adjacent the second dummy area, the repair lines may include first repair lines connected to respective ones of the dummy pixels in the first dummy area and second repair lines connected to respective ones of the dummy pixels in the second dummy area, the at least one dummy line may include at least one first dummy line connected to the dummy pixels in the first dummy area and at least one second dummy line connected to the dummy pixels in the second dummy area, and the at least one dummy wiring may include at least one first dummy wiring connected to the at least one first dummy line and at least one second dummy wiring connected to the at least one second dummy line.

When the pixels include a first defective pixel in the first active area, the first defective pixel may be connected to a corresponding one of the dummy pixels in the first dummy area via a corresponding first repair line, and a second line connected to the first defective pixel may be connected to the at least one first dummy wiring. The pixels may include a second defective pixel in the second active area, the second defective pixel may be connected to a corresponding one of the dummy pixels in the second dummy area via a corresponding second repair line, and a second line connected to the second defective pixel may be connected to the at least one second dummy wiring.

The dummy area may include a first sub-dummy area and a second dummy area that are arrayed in the second direction, the at least one dummy line may include a first dummy line to which dummy pixels in the first sub-dummy area are connected and a second dummy line to which dummy pixels in the second sub-dummy area are connected, and the at least one dummy wiring includes a first dummy wiring to which the first dummy line may be connected and a second dummy wiring to which the second dummy line is connected.

A first driver may drive the plurality of first lines; and a second driver may drive the plurality of second lines. The second driver may drive the at least one dummy line via a second line connected to the at least one dummy wiring from among the plurality of second lines.

In accordance with another embodiment, an organic light-emitting display apparatus includes a plurality of pixels arrayed in a first direction and a second direction in an active area; a plurality of dummy pixels arrayed in the second direction in a dummy area; a plurality of active lines which extend in the second direction and are connected to the pixels; a plurality of dummy lines which extend in the second direction and are selectively connected to the dummy pixels; and a plurality of dummy wirings which extend in the first direction, and are respectively connected to the dummy lines, and are selectively connected to the second lines.

In accordance with another embodiment, an organic light-emitting display apparatus includes an active area including an array of pixels, each of the pixels including a first light emitting device and a first pixel circuit that is separably connected to the first light emitting device; a repaired pixel including a second light emitting device, and a second pixel circuit that is electrically separated from the second light emitting device; a dummy pixel including a dummy pixel circuit connected to the second light emitting device; a first line connected to the second pixel circuit and the dummy pixel circuit; and a dummy wiring that connects a dummy line, which is connected to the dummy pixel circuit, to a second line connected to the second pixel circuit in an outer region of the active area. A first signal, which is transferred to the second pixel circuit, may be input to the dummy pixel circuit via the first line, and a second signal, which is transferred to the second pixel circuit, may be input the dummy pixel circuit via the second line, the dummy wiring, and the dummy line.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
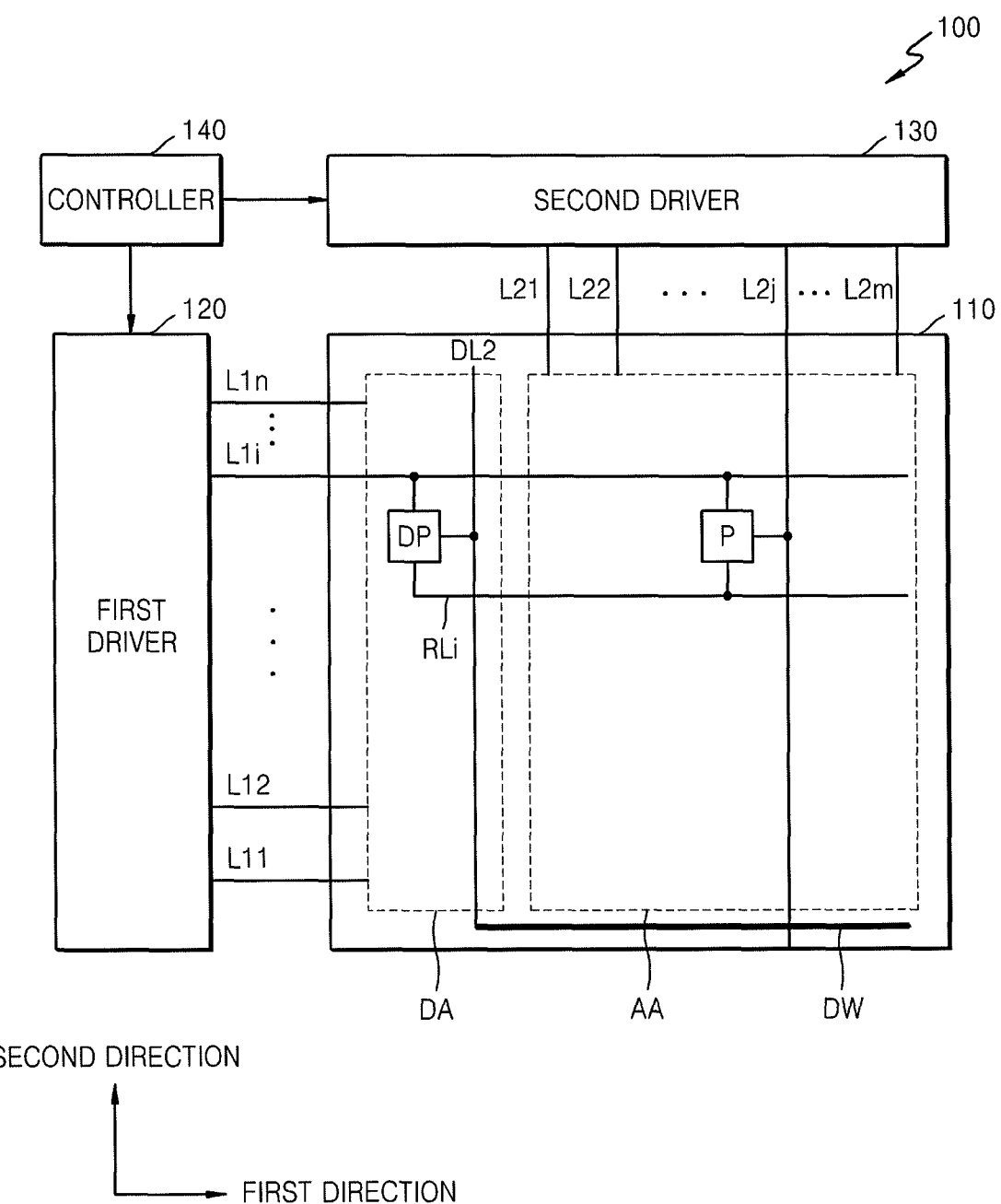
FIG. 1 illustrates an embodiment of a display apparatus.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an embodiment of a display apparatus 100 which includes a display panel 110, a first driver 120, a second driver 130, and a controller 140. The first driver 120, the second driver 130, and the controller 140 may be respectively formed in separate semiconductor chips or may be integrated into a single chip. Alternatively, the first driver 120 and/or the second driver 130 may be formed on a substrate on which the display panel 110 is formed.

An active area AA and a dummy area DA may be defined in the display panel 110. The dummy area DA may be disposed near or adjacent to the active area AA. For example, the dummy area DA may be left or right of the active area AA. Alternatively, dummy areas DA may be left and right of the active area AA. Alternatively, the dummy area DA may be above and/or below the active area AA.

In the active area AA, a plurality of pixels P are arrayed in a first direction and a second direction. The pixels P are connected to respective first lines L11-L1$n$ that extend in a first direction and second lines L21-L2$m$ that extend in a second direction. In one embodiment, the pixels P may be separably connected to the first lines L11-L1$n$. Alternatively, the pixels P may be separably connected to the second lines L21-L2$m$. Alternatively, the pixels P may be separably connected to the first lines L11-L1$n$ and the second lines L21-L2$m$.

The display panel 110 may include repair lines RLi that extend parallel to the first lines L11-L1$n$. The repair lines RLi are connected to dummy pixels DP and may be arrayed such that the repair lines RLi are connectable to the pixels P.

In the dummy area DA, the dummy pixels DP are connected to the first lines L11-L1$n$ that extend in the first direction and dummy line DL2 that are arranged in the second direction. The dummy pixels DP may be arrayed in the second direction. For example, the dummy pixels DP may be arrayed in a plurality of columns in the first direction in the dummy area DA. A plurality of dummy lines DL2 may be disposed in the dummy area DA.

In order to display various colors, a unit pixel may include a plurality of sub-pixels that respectively display different colors. In one embodiment, a pixel P may mainly refer to a sub-pixel. In another embodiment, a pixel P may refer to a unit pixel that includes a plurality of sub-pixels. Thus, pixel P may be understood to correspond to a single sub-pixel or a plurality of sub-pixels that form the unit pixel.

Likewise, a dummy pixel DP may be understood to correspond to one dummy pixel circuit or a plurality of dummy pixel circuits that correspond to the number of the plurality of sub-pixels forming the unit pixel. The description that the dummy pixel DP is provided may be understood to correspond to the case where a plurality of dummy pixel circuits are provided. A dummy line that is connected to the dummy pixel DP may be understood as including a plurality of dummy lines that are respectively connected to the plurality of dummy pixel circuits.

According to one embodiment, the terms "connectable", "connectably", or the like, may indicate that elements may be connected by laser, or the like, during a repair process. For example, in one embodiment, when a first member and a second member are connectably disposed, it may be understood that the first and second members are not actually connected to each other, but that the first and second members may be connected to each other during the repair process. The phrase "selectively connected" may also have this meaning.

In terms of structure, the first and second members that are connectable may be disposed so that the first and second members cross each other in an overlapping region, with an insulating layer between them. During the repair process, when a laser is irradiated onto the overlapping region, the insulating layer in the overlapping region is destroyed. Thus, the first and second members are electrically connected to each other.

In addition, according to one embodiment, the terms "separable", "separably", or the like may indicate that elements may be separated by using laser, etc., during the repair process. For example, when the first and second members are separably connected, this may correspond to the situation where the first and second members are actually connected to each other, but then are electrically separated from each other during the repair process. Also, the phrase "separably connected" may be understood to mean able to be separated or electrically disconnected from.

In terms of structure, the first and second members that are separably connected may be disposed so that the first and second members are connected by a conductive connecting member. When laser is irradiated onto the conductive connecting member during the repair process, the conductive connecting member melts and is divided. Thus, the first and second members are electrically connected to each other. For example, the conductive connecting layer may include a silicon layer that may melt when laser is irradiated. Alternatively, the conductive connecting layer may melt and be divided by Joule heat generated by electric current.

The display panel 110 includes dummy wiring DW that extends in the first direction and is connectable to the dummy line DL2 and the second lines L21-L2m. The dummy wiring DW may be disposed in a dead space in an outer region of the active area AA and the dummy area DA. A dead space, for example, may refer to a region in the display panel 110 where the pixels P and the dummy pixels DP are not disposed. Because the dummy wiring DW is disposed in the dead space, the dummy wiring DW may be formed with a large design margin. For example, the dummy wiring DW may have a larger width and/or thickness so that line resistance of the dummy wiring DW is reduced.

The dummy wiring DW may be formed, for example, using a material with low resistance. For example, the dummy wiring DW may be formed using a material with lower resistivity relative to materials used for the first lines L11-L1n and the second lines L21-L2m. Because the first lines L11-L1n and the second lines L21-L2m cross each other on the display panel 110, the first lines L11-L1n and the second lines L21-L2m may be disposed on different layers, and may be formed using different materials according to a pixel structure, although this is not a necessity.

For example, the first lines L11-L1n may be formed using a material with relatively higher resistivity, and the second lines L21-L2m may be formed using a material with relatively lower resistivity. For example, the first lines L11-L1n may include molybdenum (Mo) and the second lines L21-L2m may include aluminum (Al).

The second lines L21-L2m may further include titanium (Ti). For example, the second lines L21-L2m may have a structure in which a titanium (Ti) layer, an aluminum (Al) layer, and a titanium (Ti) layer are sequentially stacked, i.e., a Ti/Al/Ti structure. According to one embodiment, the dummy wiring DW and the second lines L21-L2m may be simultaneously formed using the same material.

The dummy wiring DW may have the same structure as the second lines L21-L2m, e.g., a titanium (Ti) layer, an aluminum (Al) layer, and a titanium (Ti) layer that are sequentially stacked, i.e., a Ti/Al/Ti structure. According to another embodiment, the dummy wiring DW and the first lines L11-L1n may be simultaneously formed using the same material.

A plurality of dummy wirings DW may be on the display panel 110. A plurality of defective pixels in the display panel 110 may be repaired. The number of repairable defective pixels, for example, may be equal to or greater than the number of dummy wirings DW.

The display panel 110 may be a flat display panel such as but not limited to an organic light-emitting display, a thin film transistor liquid crystal display (TFT-LCD), a plasma display panel (PDP), or a light-emitting diode (LED) display. Each pixel P may include a display device and a pixel circuit separably connected to the display device. The display device may include an organic emission layer or a liquid crystal layer. When the display device includes an organic emission layer, the display device may be referred to as a light emitting device.

The first driver 120 may provide a first control signal to the pixels P via the first lines L11-L1n; and the second driver 130 may provide a second control signal to the pixels P via the second lines L21-L2m. As illustrated in FIG. 1, the second driver 130 is not directly connected to the dummy line DL2. The controller 140 may control the first and second drivers 120 and 130 according to horizontal and vertical sync signals. A first power voltage source ELVDD, a second power voltage source ELVSS, a light-emission control signal EM, and an initialization voltage Vint may be applied to the pixels P under control of the controller 140.

The first lines L11-L1n may be scan lines that transmit scan signals to the pixels P; and the second lines L21-L2m may be data lines that transmit data signals to the pixels P. In this case, the first driver 120 may be a scan driver that generates and provides the scan signals to the pixels P; and the second driver 130 may be a data driver that provides data signals having gray voltages that correspond to digital image data with gray scales to the pixels P. The present embodiment will be described in detail with reference to FIG. 2.

According to another embodiment, the first lines L11-L1n may be the data lines that transmit the data signals to the pixels P; and the second lines L21-L2m may be the scan lines that transmit the scan signals to the pixels P. In this case, the second driver 130 may be a scan driver that generates and provides the scan signals to the pixels P, and the first driver 120 may be a data driver that provides the data signals having gray voltages that correspond to digital image data with gray scale values to the pixels P.

Each of the pixels P may include a light emitting device and a pixel circuit that is separably connected to the light emitting device. Each of the dummy pixels DP may include a dummy pixel circuit. For example, when the pixel P in FIG. 1 is a defective pixel, a light emitting device of the defective pixel is separated from a pixel circuit of the defective pixel. Then, the light emitting device of the defective pixel may be connected to a corresponding dummy pixel DP via a corresponding repair line RLi.

In addition, the second line L2j connected to the defective pixel may be connected to the dummy line DL2 via the dummy wiring DW. The scan signals applied to the defective pixel are applied to the dummy pixel DP via the first line L1i. The data signals applied to the defective pixel are applied to the dummy pixel DP via the second line L2j, the dummy wiring DW connected to the second line L2j, and the dummy line DL2 connected to the dummy wiring DW. The dummy pixel DP generates a driving current that corresponds to the data signals. The driving current is supplied to the light emitting device of the defective pixel via the repair line RLi. The light emitting device emits light with a brightness level that corresponds to the data signals. Thus, the light emitting device of the defective pixel operates normally using the dummy pixel DP.

According to another embodiment where the first lines L11-L1n are the data lines and the second lines L21-L2m are the scan lines, the scan signals applied to the defective pixel are applied to the dummy pixel DP via the second line L2j, the dummy wiring DW connected to the second line L2j, and the dummy line DL2 connected to the dummy wiring DW. The data signals applied to the defective pixel are applied to the dummy pixel DP via the first line L1i. The dummy pixel DP generates the driving current that corresponds to the data signals. Thus, the light emitting device of the defective pixel emits light normally based on the driving current.

According to at least one embodiment, the terms "corresponding," "correspondingly," or the like, may indicate that elements are disposed on the same columns or rows when taken in context. For example, when the first member is said to be connected to a corresponding second member, the first member may be understood to be connected to a second member in the same column or same row as the first member.

Figure 2:
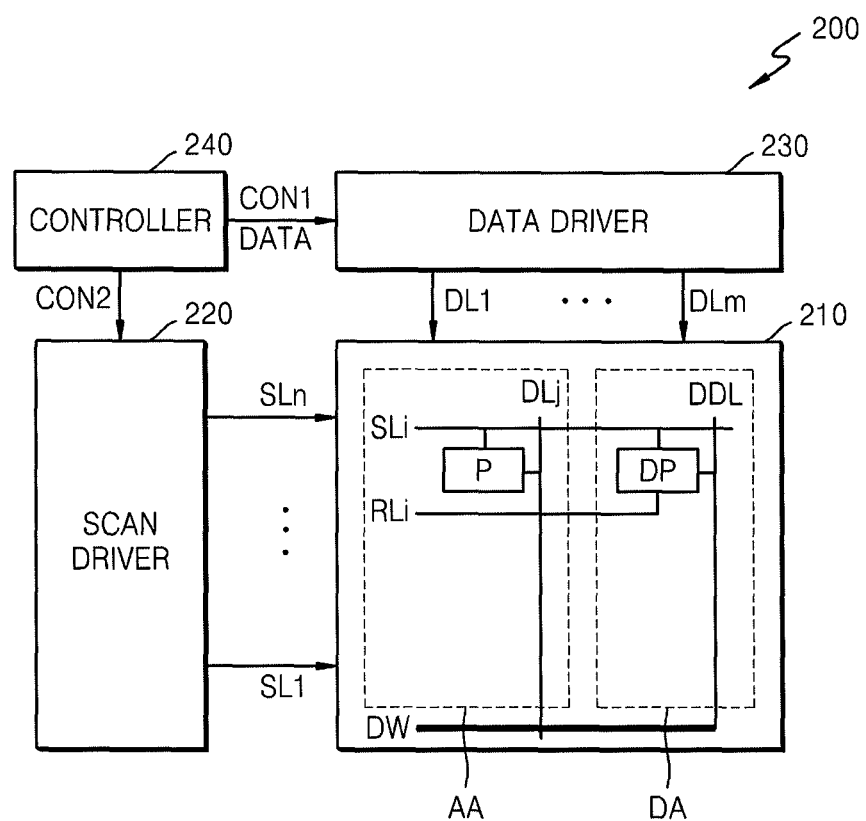
FIG. 2 illustrates an embodiment of an organic light-emitting display.

FIG. 2 illustrates an embodiment of a block diagram of an organic light-emitting display apparatus 200 which includes a display panel 210, a scan driver 220, a data driver 230, and a controller 240. The organic light-emitting display apparatus 200 of FIG. 2 may constitute to an example of the display apparatus 100 of FIG. 1. In this caser, the scan driver 220 and the data driver 230 may respectively correspond to the first driver 120 and the second driver 130 in FIG. 1.

The display panel 210 includes a plurality of data lines DL1-DLm, a plurality of scan lines SL1-SLn (where n=m or n≠m), the plurality of pixels P, and the plurality of dummy pixels DP. The active area AA and the dummy area DA are defined in the display panel 210. The plurality of pixels P are arrayed in the active area AA, and the dummy pixels DP are arrayed in the dummy area DA.

The pixels P are respectively connected to corresponding data lines (such as DLj) from among the data lines DL1-DLm, and a corresponding scan line (such as SLi) from among the scan lines SL1-SLn. The pixel P may include a pixel circuit and a light emitting device that is separably connected to the pixel circuit. The dummy pixels DP are respectively connected to a dummy data line DDL and corresponding scan lines (such as SLi) from among the scan lines SL1-SLn. The display panel 210 includes the dummy wiring DW connected to the dummy data line DDL and is connectable to the data lines DL1-DLm.

The controller 240 may generate a plurality of control signals that include a first control signal CON1 and a second control signal CON2. For example, according to horizontal and vertical sync signals, the controller 240 may generate the first control signal CON1, the second control signal CON2, and digital image data DATA.

In response to the first control signal CON1, the scan driver 220 may sequentially drive the scan lines SL1-SLn. For example, the first control signal CON1 may be an indication signal for indicating the scan driver 220 to start scan operations of the scan lines SL1-SLn. The scan driver 220 may generate the scan signals and sequentially provide the scan signals to the pixels P and the dummy pixels DP via the scan lines SL1-SLn.

The data driver 230 may drive the data lines DL1-DLm in response to the second control signal CON2 and the digital image data DATA provided by the controller 240. The data driver 230 may convert the digital image data DATA with gray scale values to data signals having corresponding gray voltages, and may provide the data signals to the pixels P via the data lines DL1-DLm. The data driver 230 may not be directly connected to the dummy data line DDL. The dummy data line DDL may be connected to any one of the data lines DL1-DLm via the dummy wiring DW. The data driver 230 may provide the data signals to the dummy pixel DP via the any one of the data lines DL1-DLm, the dummy wiring DW, or the dummy data line DDL.

Figure 3:
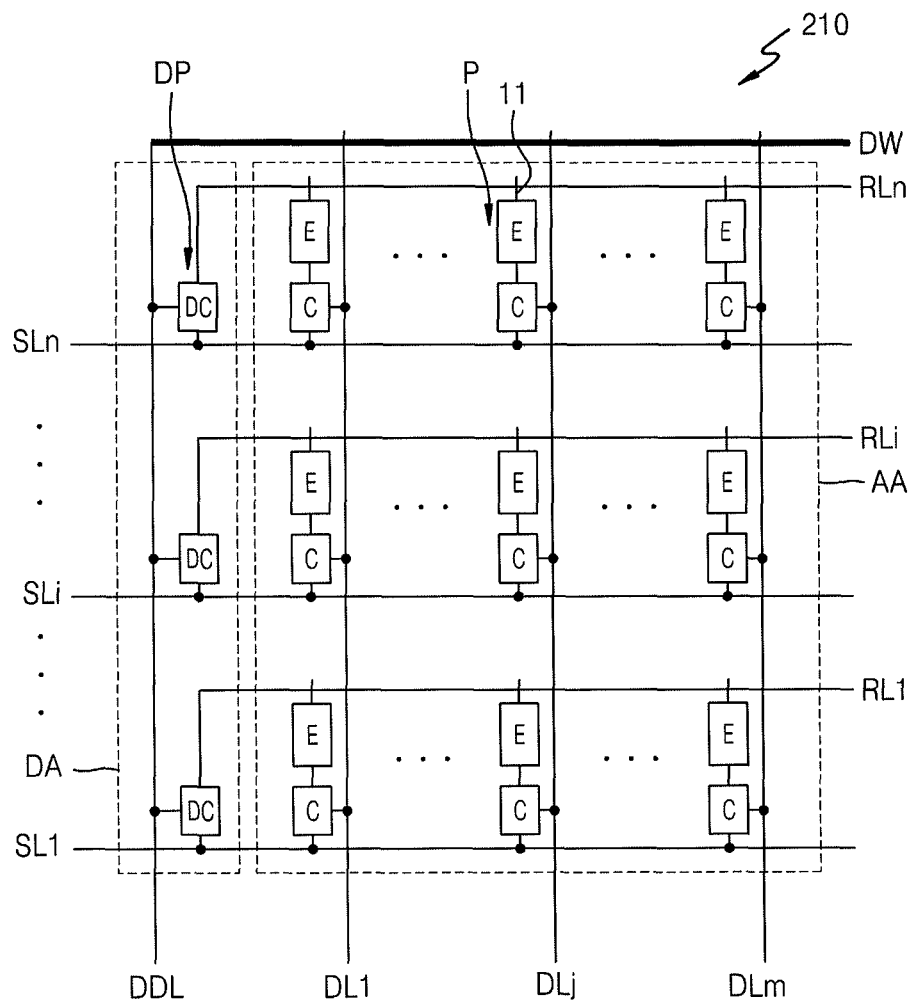
FIG. 3 illustrates an embodiment of a display panel.

FIG. 3 illustrates an embodiment of display panel 210 which includes the active area AA that displays an image by emitting light and the dummy area AA adjacent to the active area AA.

In the active area AA, the plurality of scan lines SL1-SLn and the plurality of data lines DL1-DLm are arrayed. The plurality of pixels P are arrayed at intersections of the scan lines SL1-SLn and the data lines DL1-DLm. The pixel P includes a pixel circuit C and a light emitting device E that emits light based on driving current from the pixel circuit C. The light emitting device E and the pixel circuit C may be separably connected to each other. The pixel circuit C may include at least one thin film transistor (TFT) and a capacitor. The pixel P may emit light having a color, for example, red, blue, green, or white. Colors other than red, blue, green, or white may be emitted in other embodiments. The pixel circuit C is connected to a scan line of the same row and a data line of the same column.

According to one embodiment, the pixel circuit C is separably connected to (e.g., able to be separated or electrically disconnected from) the scan line SLi of the same row and the data line DLj of the same column. To repair a defective pixel circuit C, the defective pixel circuit C may be electrically separated from the scan line SLi of the same row, electrically separated from the data line DLj of the same column, or electrically separated from both the scan line SLi and the data line DLj.

In each row, a plurality of repair lines RL1-RLn are arrayed parallel to the scan lines SL1-SLn. The light emitting device E of the pixel P is insulated from a repair line RLi of the same row. During the repair process, the light emitting device E may be electrically connected to the repair line RLi of the same row. That is, the light emitting device E of the pixel P may be disposed such that the light emitting device E is connectable to the repair line RLi of the same row.

For example, the light emitting device E may be electrically connected to a first connection member 11. The first connection member 11 may have a region overlapping a portion of the repair line RLi. An insulating layer may be interposed between the region of the first connection member 11 and the portion of the repair line RLi. The first connection member 11 may include at least one conductive layer that is formed using a conductive material. During the repair process, when laser is irradiated onto an overlapping region of the first connection member 11 and the repair line RLi, the insulating layer is destroyed. Then, the first connection member 11 and the repair line RLi are short-circuited, e.g., electrically connected to each other. Thus, the light emitting device E may be electrically connected to the repair line RLi.

The dummy area DA may be left and/or right of the active area AA. At least one dummy pixel DP may be arrayed in each row. FIG. 3 illustrates an example in which the dummy area DA is left of the active area AA, and one dummy pixel DP is in each row.

The dummy pixels DP that are respectively connected to the plurality of scan lines SL1-SLn are arrayed in the dummy area DA. The dummy data line DDL connected to the dummy pixels DP is arrayed in the dummy area DA. The dummy data line DDL extends parallel to the data lines DL1-DLm in a column direction. The repair lines RL1-RLn and the scan lines SL1-SLn extend to the dummy area DA. For example, the dummy pixel DP and the pixel P of the same row may share a scan line SL of the same row and a repair line RL of the same row.

The dummy pixel DP includes a dummy pixel circuit DC, but not a light emitting device. The dummy pixel circuit DC may be substantially the same as the pixel circuit C. Alternatively, the dummy pixel circuit DC may differ from the pixel circuit C. For example, at least one of a transistor or a capacitor of the pixel circuit C may be omitted from and/or added to the dummy pixel circuit DC. Also, respective sizes and properties of the transistor and the capacitor may be different. The dummy pixel circuit DC may include a plurality of driving transistors that are proper for light emitting devices that respectively emit different colors of light. The dummy pixel circuit DC is connected to the dummy data line DDL and the repair line RL of the same row from among the plurality of repair lines RL1-RLn.

The display panel 210 includes the dummy wiring DW, which is connected to the dummy data line DDL and which is connectable to the data lines DL1-DLm. The dummy wiring DW may be in the outer region of the active area AA and the dummy area DA. The dummy wiring DW and the data lines DL1-DLm are insulated from each other.

During the repair process, the dummy wiring DW may be electrically connected to any one of the data lines DL1-DLm. For example, the data lines DL1-DLm may be electrically connected to respective connecting members and the connecting members may have a region overlapping a portion of the dummy wiring DW. An insulating layer may be interposed between the region of the connecting members and the portion of the dummy wiring DW. Each of the connection members may include at least one conductive layer formed from a conductive material.

During the repair process, when a laser is irradiated onto an overlapping region of a connection member connected to a defective pixel and the dummy wiring DW, the insulating layer is destroyed. Then, the connection member and the dummy wiring DW are short-circuited. Thus, a data line connected to the defective pixel and the dummy wiring DW are electrically connected to each other.

Figure 4:
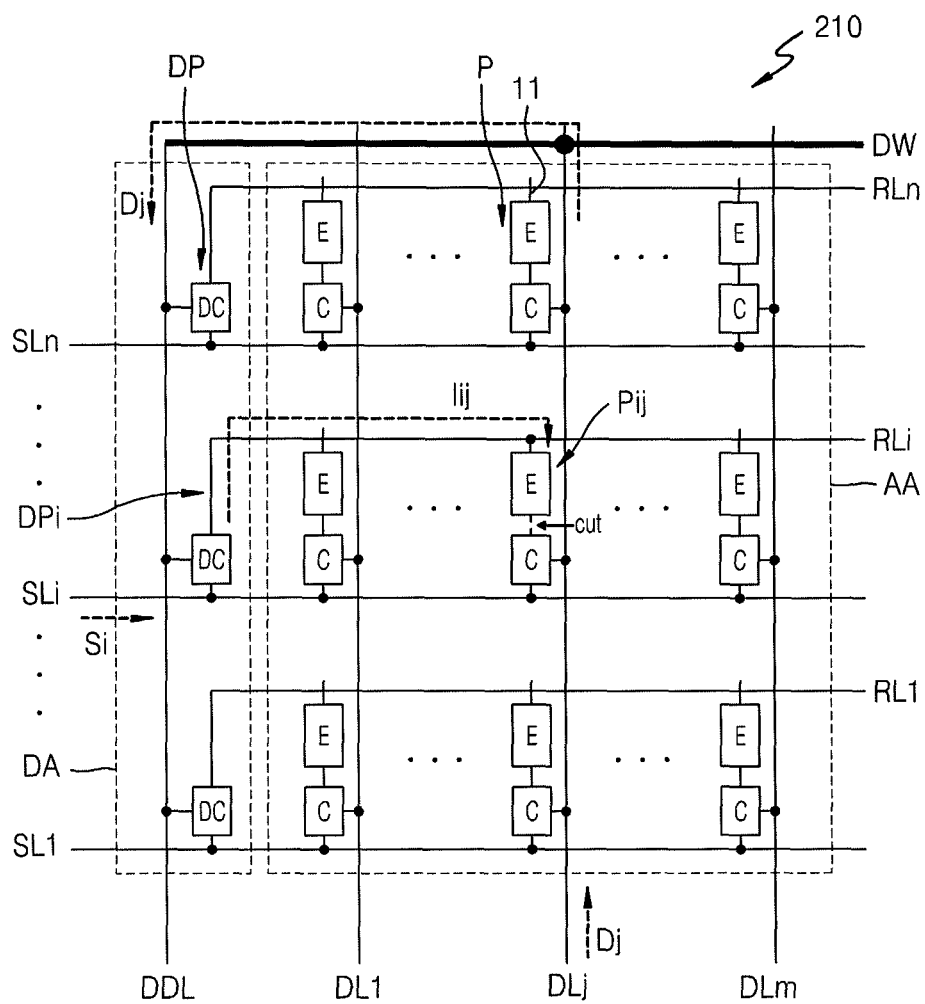
FIG. 4 illustrates an embodiment of a method for repairing a defective pixel.

FIG. 4 illustrates an embodiment of a method for repairing a defective pixel using the repair lines RL1-RLn in the display panel 210 of FIG. 3. In FIG. 4, an example is shown in which a defective pixel Pij is connected to the i-th scan line SLi and the j-th data line DLj in the active area AA. In this example, the pixel circuit C of the pixel Pij is defective and the pixel Pij is referred to as defective pixel Pij.

Referring to FIG. 4, a light emitting device E of the defective pixel Pij is separated from the pixel circuit C. For example, a laser may be irradiated onto a region in which the light emitting device E and the pixel circuit C are connected, to thereby cut the region. As a result, the light emitting device E of the defective pixel Pij may be electrically disconnected from the pixel circuit C.

Next, the light emitting device E of the defective pixel Pij and a dummy pixel circuit DC of a dummy pixel DPi are electrically connected to each other. To do so, the light emitting device E of the defective pixel Pij is connected to a repair line RLi of the same row. For example, a laser is irradiated on an overlapping region of the first connection member 11 that is connected to the light emitting device E of the defective pixel Pij and the repair line RLi of the same row. Thus, the light emitting device E is electrically connected to the repair line RLi of the same row. Because the repair line RLi is connected to the dummy pixel circuit DC, the light emitting device E of the defective pixel Pij is connected to the dummy pixel circuit DC of the dummy pixel DPi.

Next, the data line DLj connected to the defective pixel Pij and the dummy data line DDL are electrically connected to each other. To do so, the data line DLj is connected to the dummy wiring DW. For example, a laser is irradiated onto an overlapping region of the data line DLj and the dummy wiring DW. Thus, the data line DLj and the dummy wiring DW are electrically connected to each other. Because the dummy wiring DW is connected to the dummy data line DDL, the data line DLj and the dummy data line DDL are connected to each other.

The pixel circuit C of the defective pixel Pij and the dummy pixel circuit DC of the dummy pixel DPi are commonly connected to the scan line SLi. Therefore, the pixel circuit C of the defective pixel Pij and the dummy pixel circuit DC of the dummy pixel DPi both respond to the same scan signal Si transferred through the scan line SLi. The data line DLj, connected to the pixel circuit C of the defective pixel Pij, is connected to the dummy data line DDL via the dummy wiring DW. Thus, a data signal Dj transferred to the pixel circuit C of the defective pixel Pij is also transferred to the dummy pixel circuit DC of the dummy pixel Dpi, via the dummy wiring DW and the dummy data line DDL.

The dummy pixel circuit DC generates a driving current Iij that corresponds to the data signal Dj, and provides the driving current Iij to the light emitting device E of the defective pixel Pij via the repair line RLi. The light emitting device E of the defective pixel Pij emits light having a brightness level corresponding to the data signal Dj based on the driving current Iij. Thus, the defective pixel Pij may be repaired using the dummy pixel Dpi of the same row to be a normal pixel.

According to the present embodiment, because the dummy data line DDL is connected to the data line DLj via the dummy wiring DW, it is not necessary to separately drive the dummy data line DDL. Therefore, additional timing circuits or signals are not required. Also, the data driver does not have to be modified to separately drive the dummy data line DDL, and it is possible to continue using an existing data driver and an existing scan driver.

When a plurality of pixels P in the same column are defective, the defective pixels may be repaired using the dummy pixels DP that are respectively disposed in the same row as a row of each of the defective pixels.

Figure 5:
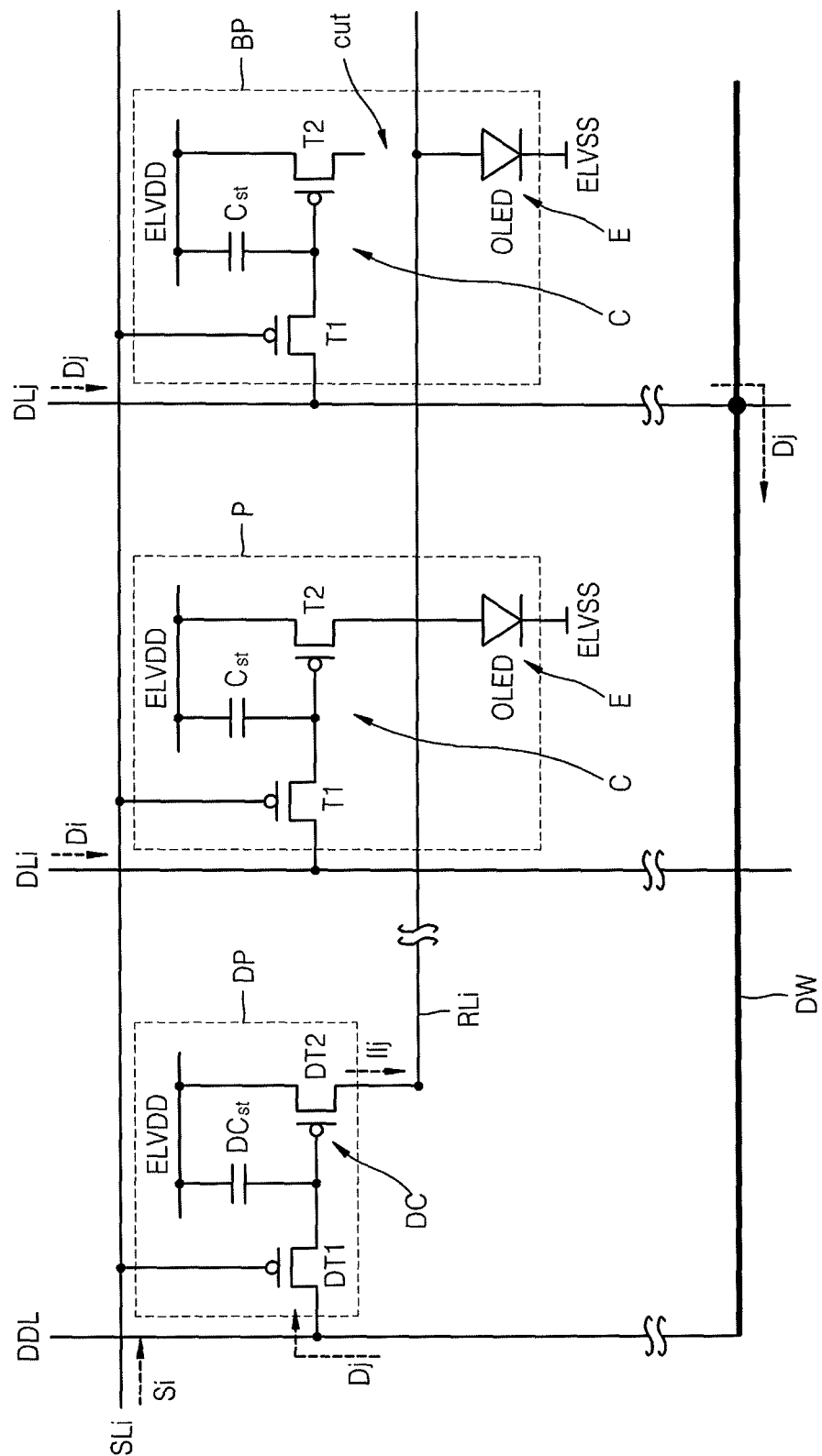
FIG. 5 illustrates a circuit diagram of a dummy pixel, a pixel, and a defective pixel that is repaired according to one embodiment.

FIG. 5 illustrates an example of a circuit diagram of the dummy pixel DP, the pixel P, and a defective pixel BP that is repaired according to one embodiment. Referring to FIG. 5, the pixel P includes the light emitting device E and the pixel circuit C. The light emitting device E includes a first electrode, a second electrode opposite to the first electrode, and an organic light-emitting diode (OLED) that includes an emission layer (EML) between the first and second electrodes. The first and second electrodes may be an anode and a cathode, respectively, or vice versa. The first electrode may be referred to as a pixel electrode. The pixel circuit C may include, for example, a first transistor T1, a second transistor T2, and a capacitor Cst. The pixel circuit may have a different structure in other embodiments.

The first transistor T1 includes a gate electrode connected to the scan line SLi, a first electrode connected to a data line DLi, and a second electrode connected to a gate electrode of the second transistor T2, and a first electrode of the capacitor Cst.

The second transistor T2 includes the gate electrode connected to the second electrode of the first transistor T1, a first electrode to which the first power voltage source ELVDD is applied, and a second electrode connected to the pixel electrode as the first electrode of the light emitting device E.

The capacitor Cst includes the first electrode connected to the second electrode of the first transistor T1 and a second electrode to which the first power voltage source ELVDD applied.

When the scan signal Si transferred through the scan line SLi is activated, the data signal Di is received at the first electrode of the first transistor T1 through the data line DLj. Also, the received data signal Di is transferred to the first electrode of the capacitor Cst. Accordingly, a voltage that corresponds to the data signal Di is charged in the capacitor Cst; driving current that corresponds to the voltage charged in the capacitor Cst is transmitted to the light emitting device E via the second transistor T2. Thus, the light emitting device E emits light corresponding to the data signal Di.

In FIG. 5, a 2 Tr-1 Cap structure is illustrated, e.g., the pixel P includes two transistors and one capacitor. In other embodiments, the pixel P may have a different structure, e.g., two or more transistors and/or one or more capacitors.

The dummy pixel DP is disposed in the same row as the pixel P, and only includes the dummy pixel circuit DC but not the light emitting device E. The dummy pixel circuit DC may be the same as the pixel circuit C. According to another embodiment, the dummy pixel circuit DC may be different from the pixel circuit C.

The dummy pixel circuit DC may include a first dummy transistor DT1 connected to the scan line SLi and the dummy data line DDL, a second dummy transistor DT2 connected between the first power voltage source ELVDD and the first dummy transistor DT1, and a dummy capacitor DCst connected between the first power voltage source ELVDD and the first dummy transistor DT1. In other embodiments, the dummy pixel circuit DC may have a different structure, including but not limited to one in which at least one of the transistors or the capacitor is omitted or additional elements are added.

The dummy data line DDL is connected to the dummy wiring DW. The dummy wiring DW is connectable to data lines including the data lines DLi and DLj.

The light emitting device E of the defective pixel BP is separated from the pixel circuit C of the defective pixel BP by laser-cutting or another technique. The light emitting device E of the defective pixel BP is connected to the repair line RLi using laser or another technique. Accordingly, the light emitting device E of the defective pixel BP is connected to the dummy pixel circuit DC.

Also, the data line DLj, which is connected to the pixel circuit C of the defective pixel BP, is connected to the dummy wiring DW using laser or another technique. The data line DLj, which is connected to the pixel P that is operating normally, is not connected to the dummy wiring DW. The dummy pixel circuit DC of the dummy pixel DP and the pixel circuit C of the defective pixel BP respond to the same scan signal Si.

In addition, the dummy pixel circuit DC receives the data signal Dj that is transferred to the pixel circuit C of the defective pixel BP, via the dummy wiring DW and the dummy data line DDL. The dummy pixel circuit DC generates the driving current Iij that corresponds to the data signal Dj, and provides the driving current Iij to the light emitting device E of the defective pixel BP via the repair line RLi. The light emitting device E of the defective pixel BP emits light having a brightness level that corresponds to the data signal Dj based on the driving current Iij. Thus, the defective pixel BP may be repaired using the dummy pixel DP to be a normal pixel.

Figure 6:
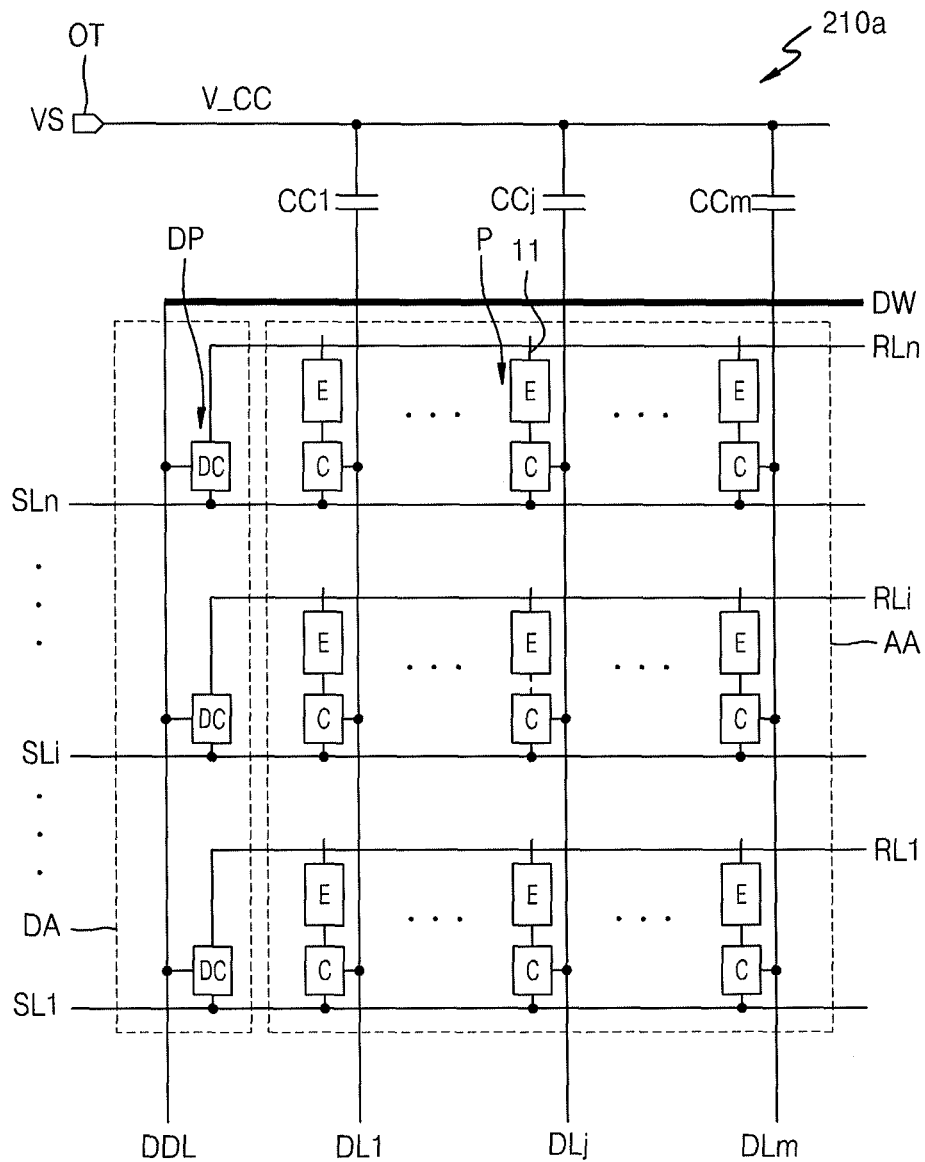
FIG. 6 illustrates another embodiment of a display panel.

FIG. 6 illustrates another embodiment of a display panel 210a, which, for example, may correspond to the display panel 210 in FIG. 2. The display panel 210a may be substantially the same as the display panel 210 in FIG. 3, except that it includes compensation capacitors CC1-CCm.

The compensation capacitors CC1-CCm are separably connected to the data lines DL1-DLm, respectively. Each of the compensation capacitors CC1-CCm includes a first electrode that is separably connected to the data lines DL1-DLm, and a second electrode that is connected in common. The first electrode of each of the compensation capacitors CC1-CCm may be connected to the data lines DL1-DLm via a polysilicon layer. When the polysilicon layer is melted, for example, by a laser, the compensation capacitors CC1-CCm and the data lines DL1-DLm are separated from each other.

A compensation voltage V_CC may be applied in common to the second electrodes of the compensation capacitors CC1-CCm. The compensation voltage V_CC may be a ground voltage or another reference voltage. The compensation voltage V_CC may be generated inside the display apparatus 200, but this is not a necessity.

According to another embodiment, the second electrodes of the compensation capacitors CC1-CCm may be connected in common to an external terminal OT, to which an external signal VS may be input. The external terminal OT may be used for testing. During testing, first, the display panel 210a may be set to display a certain color. Then, a signal VS having a variable voltage level may be applied via the external terminal OT. In this case, the compensation voltage V_CC may not be applied.

When the compensation capacitors CC1-CCm are operating normally, the pixels P connected to the compensation capacitors CC1-CCm continue displaying light of certain color (or gray scale valued) corresponding to the voltage level of the signal VS. However, when one or more of the compensation capacitors CC1-CCm is defective, the color of light that is displayed by the pixels P connected to the defective compensation capacitor(s) changes. By performing the testing process described above, it may be determined whether there are defective compensation capacitors CC1-CCm or defective pixels P.

Figure 7:
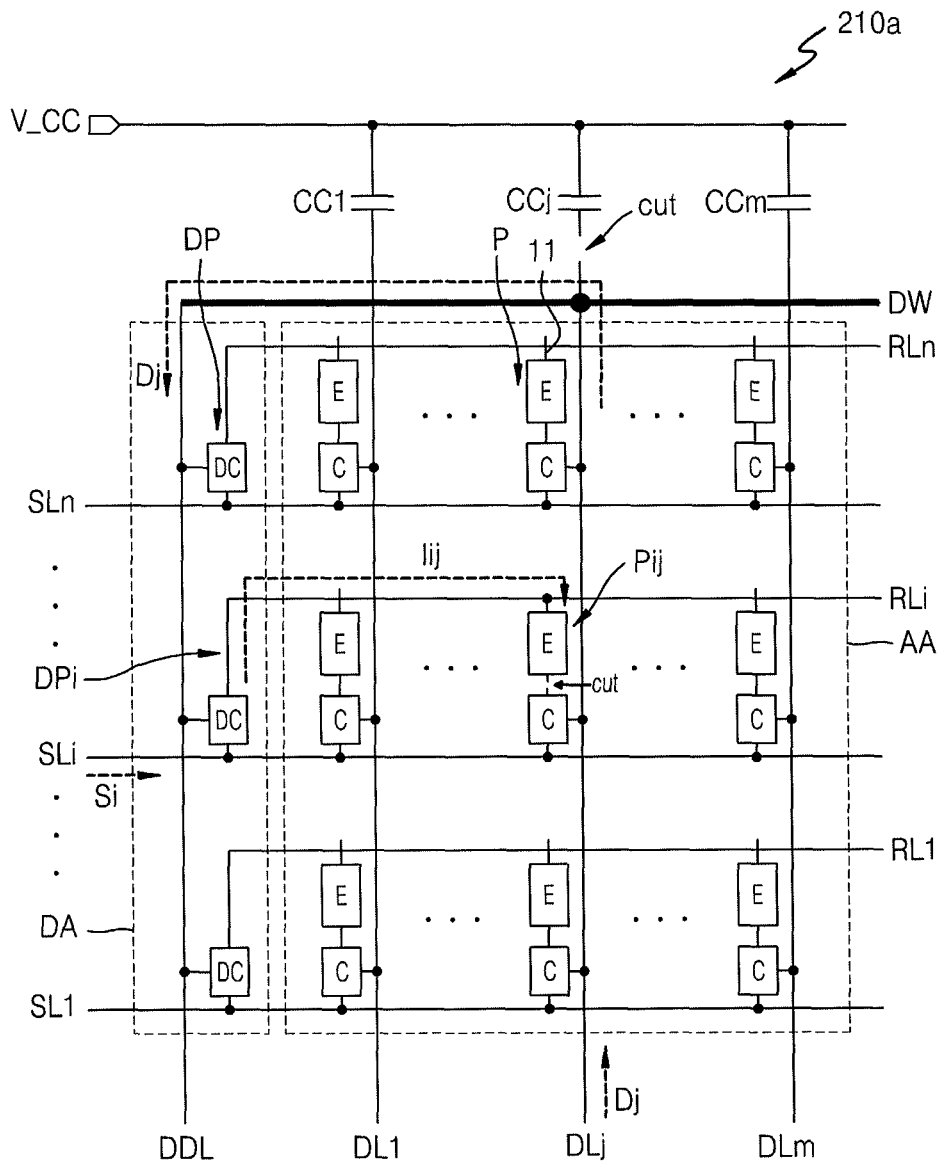
FIG. 7 illustrates another embodiment of a method for repairing a defective pixel.

FIG. 7 illustrates an embodiment of a method for repairing a defective pixel using the repair line RLi in the display panel 210a of FIG. 6. The display panel 210a may be substantially the same as the display panel 210 of FIG. 4, except for the compensation capacitors CC1-CCm.

Referring to FIG. 7, from among the pixels P formed in the active area AA, it is supposed that the pixel Pij, which is connected to the i-th scan line SLi and the j-th data line DLj, is defective. Referring to FIG. 7. The light emitting device E of the pixel Pij is separated from the pixel circuit C. The light emitting device E of the defective pixel Pij is connected to the repair line RLi of the same row. Then, the light emitting device E of the defective pixel Pij is connected to the dummy pixel circuit DC of the dummy pixel DPi. The data line DLj, which is connected to the defective pixel Pij, is connected to the dummy wiring DW. Thus, the data line DLj and the dummy data line DDL are electrically connected to each other.

Because the data line DLj is electrically connected to the dummy data line DDL and the dummy wiring DW, an electric property of the data line DLj is different from other data lines DL1 and DLm. For example, the data line DLj may have a higher resistance and capacitance than the other data lines DL1 and DLm. In particular, the capacitance of the data line DLj may greatly increase. As a result of the increase in capacitance of the data line DLj, resistance-capacitance (RC) delay of the data line DLj increases. For example, when a data signal having low gray scale value is applied to the data line DLj, due to an increase in RC delay, capacitors of the pixel circuit C and the dummy pixel circuit DC that are connected to the data line DLj may not be sufficiently charged. As a result, the viewer may notice deterioration in picture quality on only the pixels P in the same column as the pixel Pij that is repaired.

As described above, the display panel 210a includes compensation capacitors CC1-CCm that are separably connected to the data lines DL1-DLm, respectively. The data line DLj connected to the pixel Pij is separated from a compensation capacitor CCj that corresponds to the data line DLj. The other data lines DL1 and DLm are connected to the compensation capacitors CC1 and CCm, respectively (e.g., "corresponding compensation capacitors CC1 and CCm"). A magnitude of the capacitance of the corresponding compensation capacitors CC1-CCm may correspond to an amount of increase of parasitic capacitance when the data line DLj is connected to the dummy data line DDL and the dummy wiring DW.

Respective parasitic capacitances of the other data lines DL1 and DLm increase due to the corresponding compensation capacitors CC1 and CCm. The parasitic capacitance of the data line DLj increases due to the dummy data line DDL and the dummy wiring DW. Thus, a difference between respective parasitic capacitances of the data lines DL1 and DLm, and DLj, decreases. Accordingly, the RC delay increases overall. The increased RC delay may be easily modified by performing, for example, data or gamma voltage adjustment. Also, even if the RC delay is not modified, the viewer may not notice deterioration in picture quality on the pixels P in the same row as the pixel Pij that is repaired.

Figure 8:
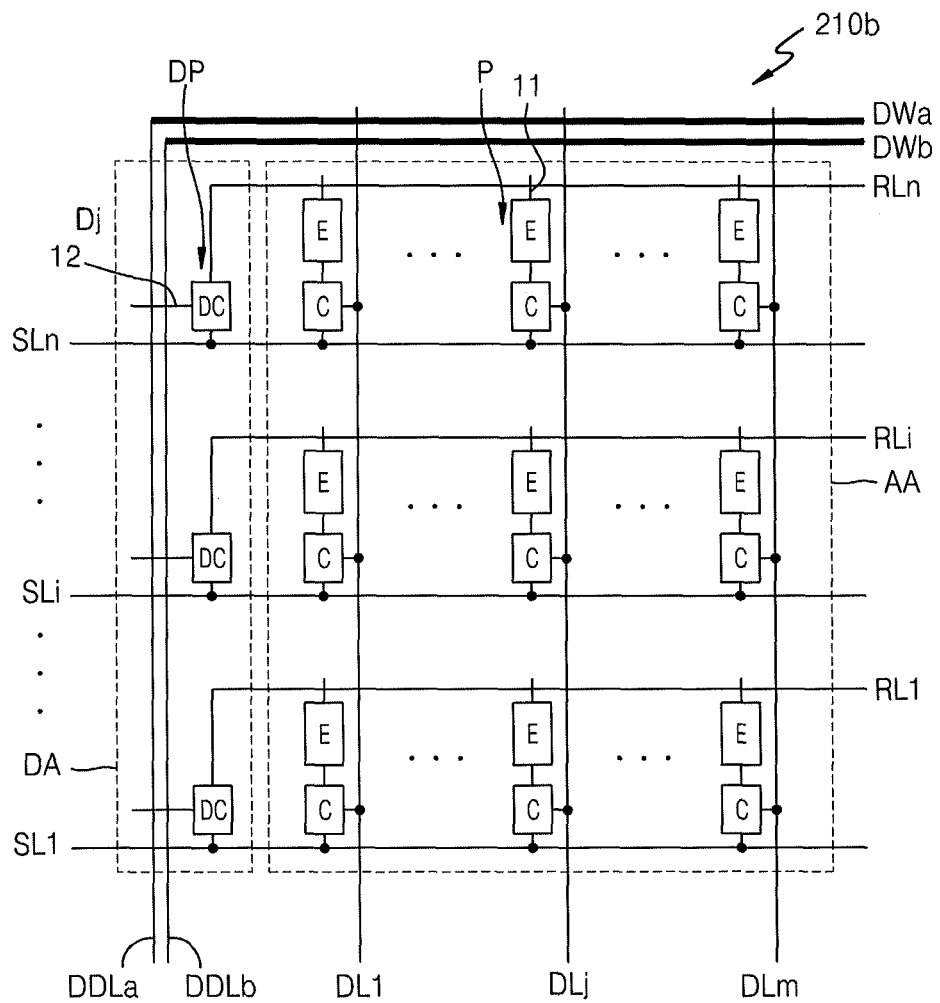
FIG. 8 illustrates another embodiment of a display panel.

FIG. 8 illustrates another embodiment of a display panel 210b, which, for example, may be substantially the same as the display panel 210 of FIG. 3 with the following exception. The display panel 210b includes a first dummy data line DDLa and a second dummy data line DDLb which are connectable to the dummy pixels DP, and a first dummy wiring DWa and a second dummy wiring DWb which are respectively connected to the first and second dummy data lines DDLa and DDLb.

The first and second dummy data lines DDLa and DDLb may be arrayed in the dummy area DA of the display panel 210b. The dummy pixels DP may be disposed such that the dummy pixels DP are connectable to the first and second dummy data lines DDLa and DDLb.

For example, the dummy pixels DP are insulated from the first and second dummy data lines DDLa and DDLb, and may be connected to any one of the first and second dummy data lines DDLa and DDLb during the repair process. In one embodiment, dummy pixels DP may be respectively connected to second connection members 12 that overlap both the first and second dummy data lines DDLa and DDLb. When a laser is irradiated onto an overlapping region of a second connection member 12 and the first dummy data line DDLa, the dummy pixel DP connected to the second connection member 12 is connected to the first dummy data line DDLa. In the same manner, the dummy pixel DP connected to second connection member 12 may be connected to the second dummy data line DDLb.

The first and second dummy wirings DWa and DWb are respectively connected to the first and second dummy data lines DDLa and DDLb. The data lines DL1-DLm are connectable to the first and second dummy wirings DWa and DWb. For example, the data lines DL1-DLm are insulated from the first and second dummy wirings DWa and DWb, but may be connected to the first and second dummy wirings DWa and DWb during the repair process.

According to the display panel 210b of FIG. 8, a plurality of pixels P may be repaired. For example, one pixel P may be repaired via the first dummy data line DDLa and the first dummy wiring DWa, and another pixel P may be repaired via the second dummy data line DDLb and the second dummy wiring DWb.

In FIG. 8, the first and second dummy data lines DDLa and DDLb and the first and second dummy wirings DWa and DWb are illustrated. However, more than two dummy data lines and dummy wirings may be included, and thus more than two defective pixels may be repaired using more than two dummy pixels via the dummy data lines and dummy wirings.

Figure 9:
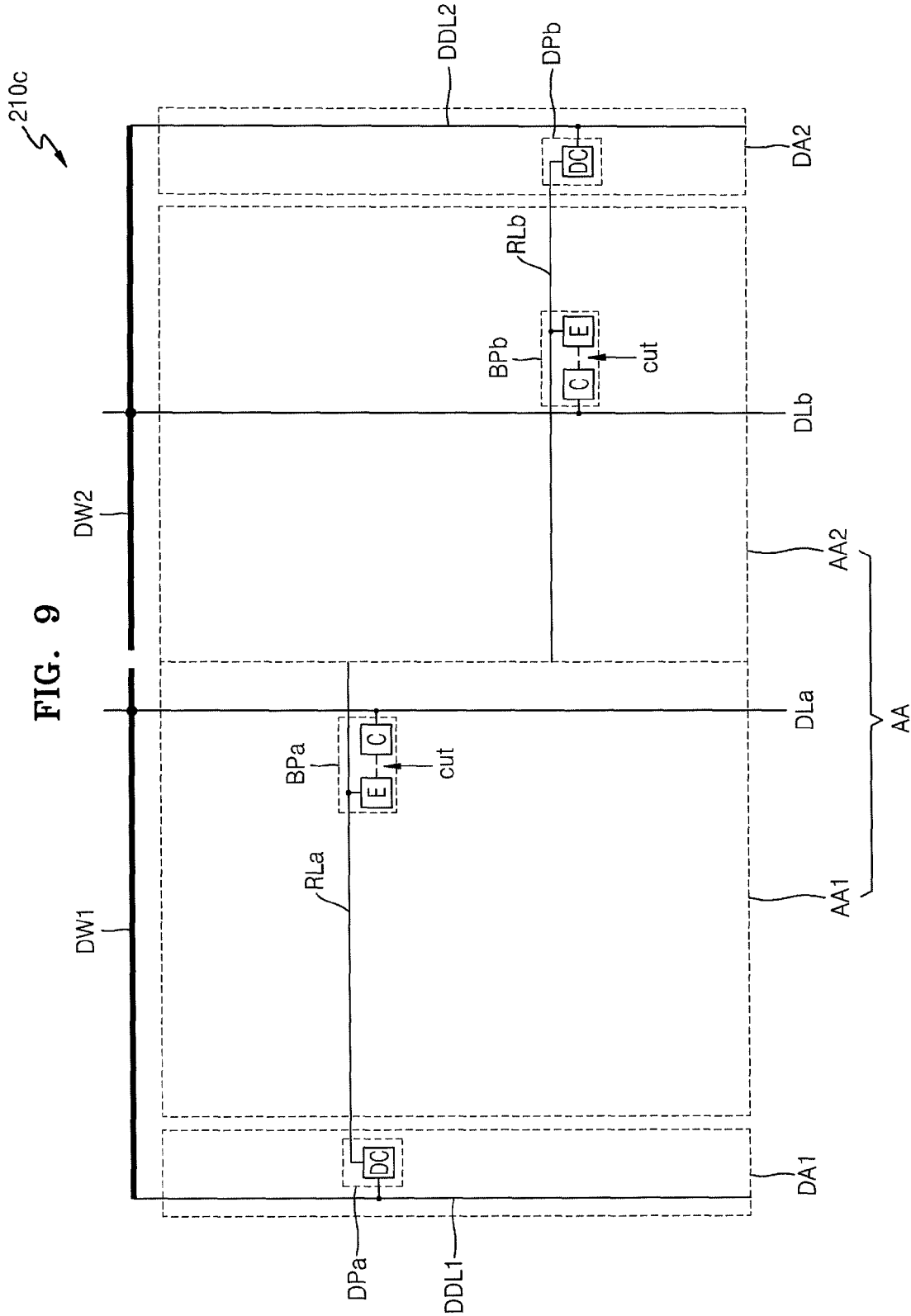
FIG. 9 illustrates another embodiment of a display panel.

FIG. 9 illustrates another embodiment of a display panel 210c, which, for example, may be substantially the same as the display panel 210 of FIG. 3 except for the following differences. For illustrative purposes only, the pixel P that operates normally is not illustrated in FIG. 9 and only a defective pixel BPa and a defective pixel BPb are illustrated. In addition, the scan lines are not illustrated.

The display panel 210c includes a first dummy area DA1 left of the active area AA, and a second dummy area DA2 right of the active area AA. In the first dummy area DA1, a first dummy data line DDL1 and a plurality of first dummy pixels (such as DPa) that are connected to the first dummy data line DDL1 are arrayed. In the second dummy area DA2, a second dummy data line DDL2 and a plurality of second dummy pixels (such as DPb) that are connected to the second dummy data line DDL2 are arrayed. The first and second dummy areas DA1 and DA2 correspond to the dummy area DA of FIG. 3.

The active area AA is divided into a first active area AA1 and a second active area AA2. A first dummy wiring DW1, which is connected to the first dummy data line DDL1, is above the first active area AA1. A second dummy wiring DW2, which is connected to the second dummy data line DDL2, is above the second active area AA2. The first and second dummy wirings DW1 and DW2 are insulated from each other. In an alternative embodiment, the first and second dummy wirings DW1 and DW2 may be below the first and second active areas AA1 and AA2. Data lines (such as DLa) are disposed on the first active area AA1 and are connectable to the first dummy wiring DW1. Data lines (such as DLb) are disposed on the second active area AA2 and are connectable to the second dummy wiring DW2.

The display panel 210c includes first repair lines (such as RLa) and second repair lines (such as RLb). The first repair lines RLa extend from the plurality of first dummy pixels DPa of the first dummy area DA1 to the first active area AA1. The second repair lines RLb extend from the second dummy pixels DPb of the second dummy area DA2 to the second active area AA2. The first repair lines RLa and the second repair lines RLb are insulated from each other.

At least one defective pixel BPa in the first active area AA1 may be repaired using the first repair line RLa, the first dummy wiring DW1, and the first dummy data line DDL1. A plurality of defective pixels BPa in the same column may be repaired together using a plurality of dummy pixels DPa in the same column, without additional dummy wiring or a dummy data line. The light emitting device E of the defective pixel BPa in the first active area AA1 is separated from the pixel circuit C, and is connected to the dummy pixel circuit DC of the first dummy pixel DPa in the same row as the defective pixel BPa via the first repair line RLa.

The data line DLa, which is connected to the defective pixel BPa, is connected to the first dummy wiring DW1. Data signals applied to the data line DLa are also applied to the dummy pixel circuit DC. The dummy pixel circuit DC generates driving current that corresponds to the data signals, and provides the driving current to the light emitting device E of the defective pixel BPa via the first repair line RLa. Thus, the light emitting device E emits light according to the driving current.

At least one defective pixel BPb in the second active area AA2 may be repaired using the second repair line RLb, the second dummy wiring DW2, and the second dummy data line DDL2. The light emitting device E of the defective pixel BPb in the second active area AA2 is separated from the pixel circuit C, and is connected to the dummy pixel circuit DC of the second dummy pixel DPb in the same row as the defective pixel BPb via the second repair line RLb.

The data line DLb, which is connected to the defective pixel BPb, is connected to the second dummy wiring DW2. Data signals applied to the data line DLb are also applied to the dummy pixel circuit DC. The dummy pixel circuit DC generates driving current that corresponds to the data signals, and provides the driving current to the light emitting device E of the defective pixel BPb via the second repair line RLb. Thus, the light emitting device E emits light according to the driving current.

According to the present embodiment, the at least one defective pixel BPa in the first active area AA1 and the at least one defective pixel BPb in the second active area AA2 may be repaired. In addition, according to the embodiment illustrated in FIG. 8, a plurality of defective pixels in the same row may not be repaired. However, according to the present embodiment, it is possible to repair a plurality of defective pixels in the same row.

Figure 10:
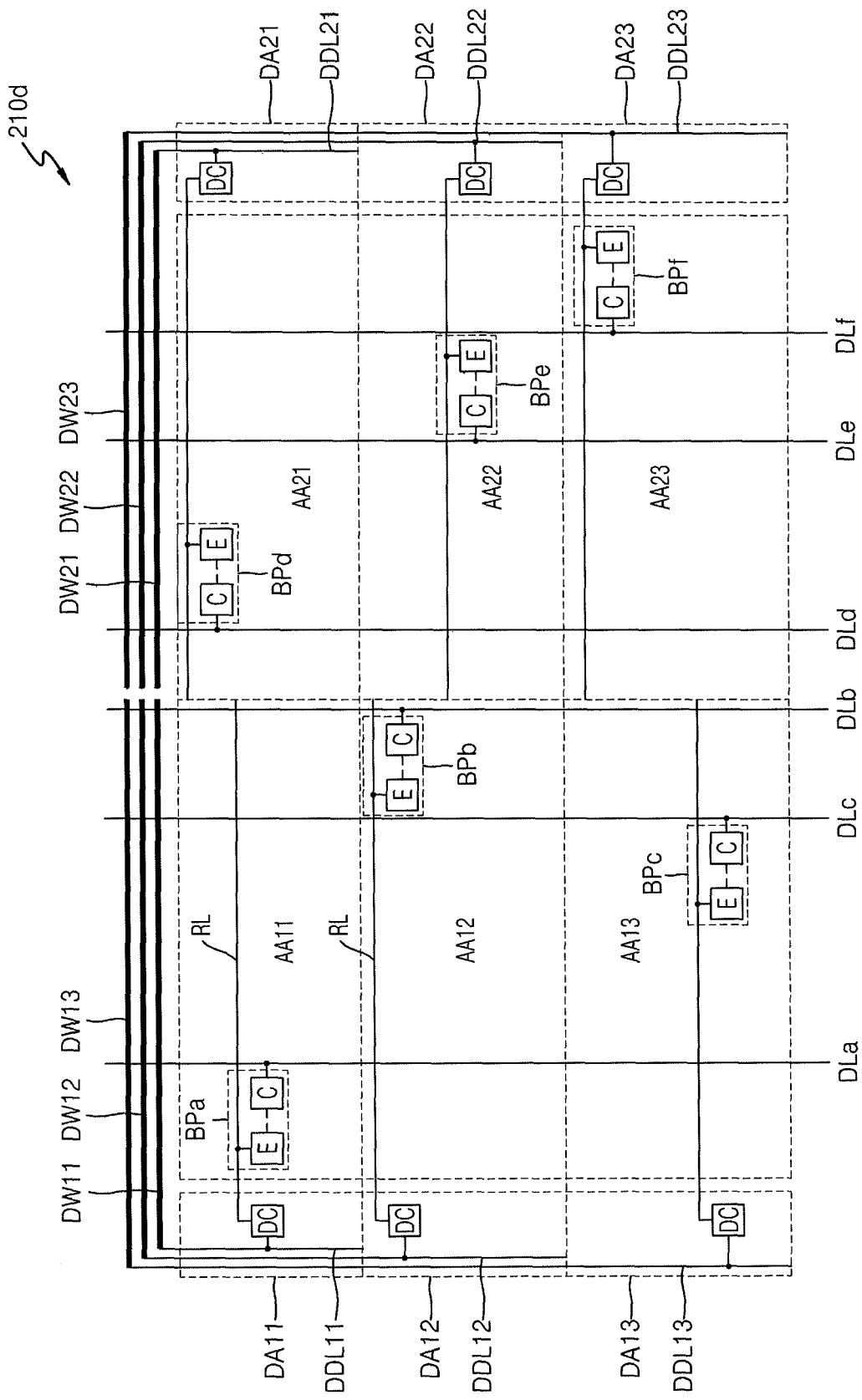
FIG. 10 illustrates another embodiment of a display panel.

FIG. 10 illustrates another embodiment of a display panel 210d, which, for example, may be substantially the same as the display panel 210c in FIG. 9 except for the following differences. The first dummy area DA1 may be divided into a plurality of sub-dummy areas DA11, DA12, and DA13. Also, the second dummy area DA2 may be divided into a plurality of sub-dummy areas DA21, DA22, and DA23. The first active area AA1 and the second active area AA2 may be respectively divided into a plurality of sub-active areas AA11, AA12, and AA13 and a plurality of sub-active areas AA21, AA22, and AA23.

The display panel 210d may include a plurality of dummy data lines DDL11, DDL12, DDL13, DDL21, DDL22, and DDL23. The dummy data lines DDL11, DDL12, and DDL13 are arrayed in the first dummy area DA1. However, the dummy data lines DDL21, DDL22, and DDL23 are arrayed in the second dummy area DA2.

The dummy pixel circuits DC arrayed in the sub-dummy area DA11 are connected to the dummy data line DDL11. The dummy pixels circuits DC arrayed in the sub-dummy area DA12 are connected to the dummy data line DDL12. The dummy pixels circuits DC arrayed in the sub-dummy area DA13 are connected to the dummy data line DDL13. The dummy pixel circuits DC arrayed in the sub-dummy area DA21 are connected to the dummy data line DDL21. The dummy pixel circuits DC arrayed in the sub-dummy area DA22 are connected to the dummy data line DDL22. The dummy pixel circuits DC arrayed in the sub-dummy area DA23 are connected to the dummy data line DDL23.

The display panel 210d may include a plurality of dummy wirings DW11, DW12, DW13, DW21, DW22, and DW23. The dummy wirings DW11, DW12, and DW13 are arrayed above and/or below the first active area AA1. The dummy wirings DW21, DW22, and DW23 are arrayed above and/or below the second active area AA2. The data lines DLa, DLb, and DLc in the first active area AA1 are respectively connectable to the dummy wirings DW11, DW12, and DW13. Data lines DLd, DLe, and DLf in the second active area AA2 are respectively connectable to the dummy wirings DW21, DW22, and DW23.

The dummy wiring DW11 is connected to the dummy data line DDL11. The dummy wiring DW12 is connected to the dummy data line DDL12. The dummy wiring DW13 is connected to the dummy data line DDL13. The dummy wiring DW21 is connected to the dummy data line DDL21. The dummy wiring DW22 is connected to the dummy data line DDL22. The dummy wiring DW23 is connected to the dummy data line DDL23.

A defective pixel BPa in the sub-active area AA11 may be repaired using the dummy pixel circuit DC, the dummy data line DDL11, and the dummy wiring DW11 in the same row and the sub-dummy area DA11. A defective pixel BPb in the sub-active area AA12 may be repaired using the dummy pixel circuit DC, the dummy data line DDL12, and the dummy wiring DW12 in the same row and the sub-dummy area DA12. A defective pixel BPc in the sub-active area AA13 may be repaired using the dummy pixel circuit DC, the dummy data line DDL13, and the dummy wiring DW13 in the same row and the sub-dummy area DA13. A defective pixel BPd in the sub-active area AA21 may be repaired using the dummy pixel circuit DC, the dummy data line DDL21, and the dummy wiring DW21 in the same row and the sub-dummy area DA21. A defective pixel BPe in the sub-active area AA22 may be repaired using the dummy pixel circuit DC, the dummy data line DDL22, and the dummy wiring DW22 in the same row and the sub-dummy area DA22. A defective pixel BPf in the sub-active area AA23 may be repaired using the dummy pixel circuit DC, the dummy data line DDL23, and the dummy wiring DW23 in the same row and the sub-dummy area DA23.

According to the present embodiment, the number of defective pixels that may be repaired may be equal to or greater than the number of sub areas. As an example, the embodiment in FIG. 10 may repair at least six defective pixels.

Figure 11:
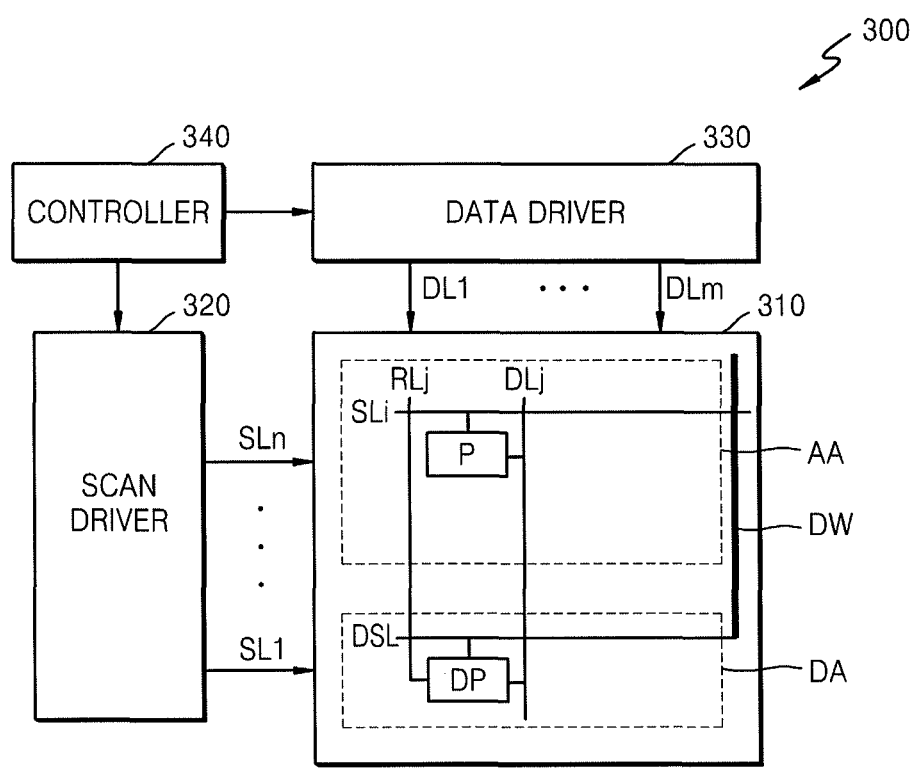
FIG. 11 illustrates another embodiment of an organic light-emitting display.

FIG. 11 illustrates an embodiment of an organic light-emitting display apparatus 300 which includes a display panel 310, a scan driver 320, a data driver 330, and a controller 340. The organic light-emitting display apparatus 300 may correspond to an example of the display apparatus 100 in FIG. 1. The scan driver 320 and the data driver 330 may respectively correspond to the second driver 130 and the first driver 120 in FIG. 1.

The display panel 310 includes the plurality of data lines DL1-DLm, the plurality of scan lines SL1-SLn, the plurality of pixels P, and the dummy pixels DP. The active area AA and the dummy area DA are defined in the display panel 310. The dummy area DA may be disposed above and/or below the active area AA. Each of the dummy pixels DP accesses a dummy scan line DSL and a data line that corresponds to each of the dummy pixels DP from among the data lines DL1-DLm. The display panel 310 includes the dummy wiring DW which is connected to the dummy scan line DSL and which is connectable to the scan lines SL1-SLn.

The scan driver 320 is not directly connected to the dummy scan line DSL. The dummy scan line DSL may be connected to one of the scan lines SL1-SLn via the dummy wiring DW. The scan driver 320 may provide the scan signals to the dummy pixel DP via one of the scan lines SL1-SLn, the dummy wiring DW, and the dummy scan line DSL.

Figure 12:
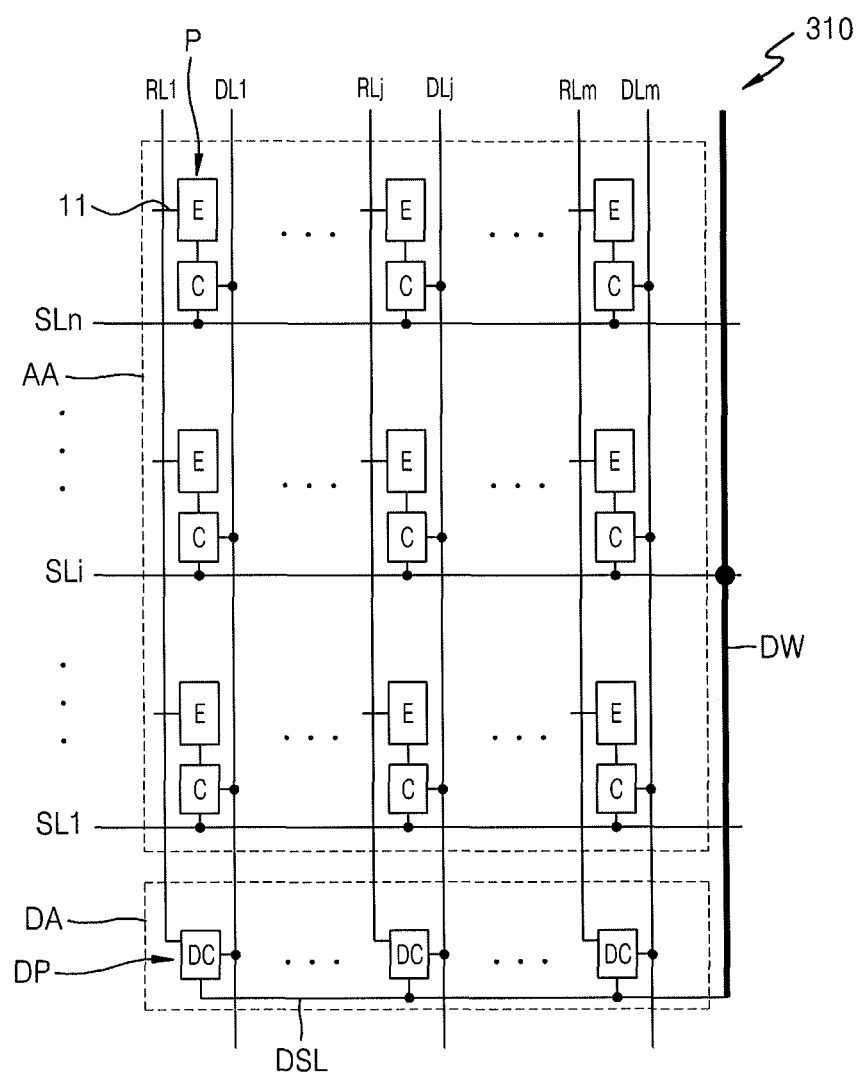
FIG. 12 illustrates an embodiment of the display panel in FIG. 11.

FIG. 12 illustrates an example of the display panel 310 of FIG. 11. Referring to FIG. 12, the display panel 310 includes the active area AA that displays an image by emitting light and the dummy area AA adjacent to the active area AA.

The plurality of scan lines SL1-SLn, the plurality of data lines DL1-DLm, and the plurality of pixels P are arrayed in the active area AA. In each column, a plurality of repair lines RL1-RLm are arrayed parallel to and separated from the data lines DL1-DLm. The light emitting device E of the pixel P is insulated from a repair line RL of the same column.

During the repair process, when a laser is irradiated onto a portion in which the first connection member 11 overlaps the repair line RL, the light emitting device E of the pixel P may be electrically connected to the repair line RL. For example, the light emitting device E of the pixel P may be connectable to the repair line RL in the same column.

The dummy area DA may be above and/or below the active area AA. At least one dummy pixel DP may be arrayed in each column. FIG. 12 illustrates an example in which the dummy area DA is below the active area AA, and one dummy pixel DP is in each column.

In the dummy area DA, each of the dummy pixels DP is connected to a dummy scan line DSL and to a respective one of the data lines DL1-DLm. The dummy scan line DSL extends parallel to the scan lines SL1-SLn in a row direction. The repair lines RL1-RLm and the data lines DL1-DLm extend to the dummy area DA. For example, the dummy pixel DP and the pixel P in the same column may share a data line DL and a repair line RL in the same column.

The dummy pixel DP includes the dummy pixel circuit DC, but not the light emitting device. The dummy pixel circuit DC is connected to the dummy scan line DSL and a repair line RL of the same column from among the plurality of repair lines RL1-RLm.

The display panel 210 includes the dummy wiring DW, which is connected to the dummy scan line DSL and which is connectable to the scan lines SL1-SLn. The dummy wiring DW may be in an outer region of the active area AA and the dummy area DA. The dummy wiring DW and the scan lines SL1-SLn are insulated from each other. During the repair process, the dummy wiring DW may be electrically connected to one of the scan lines SL1-SLn using a laser or another technique.

Figure 13:
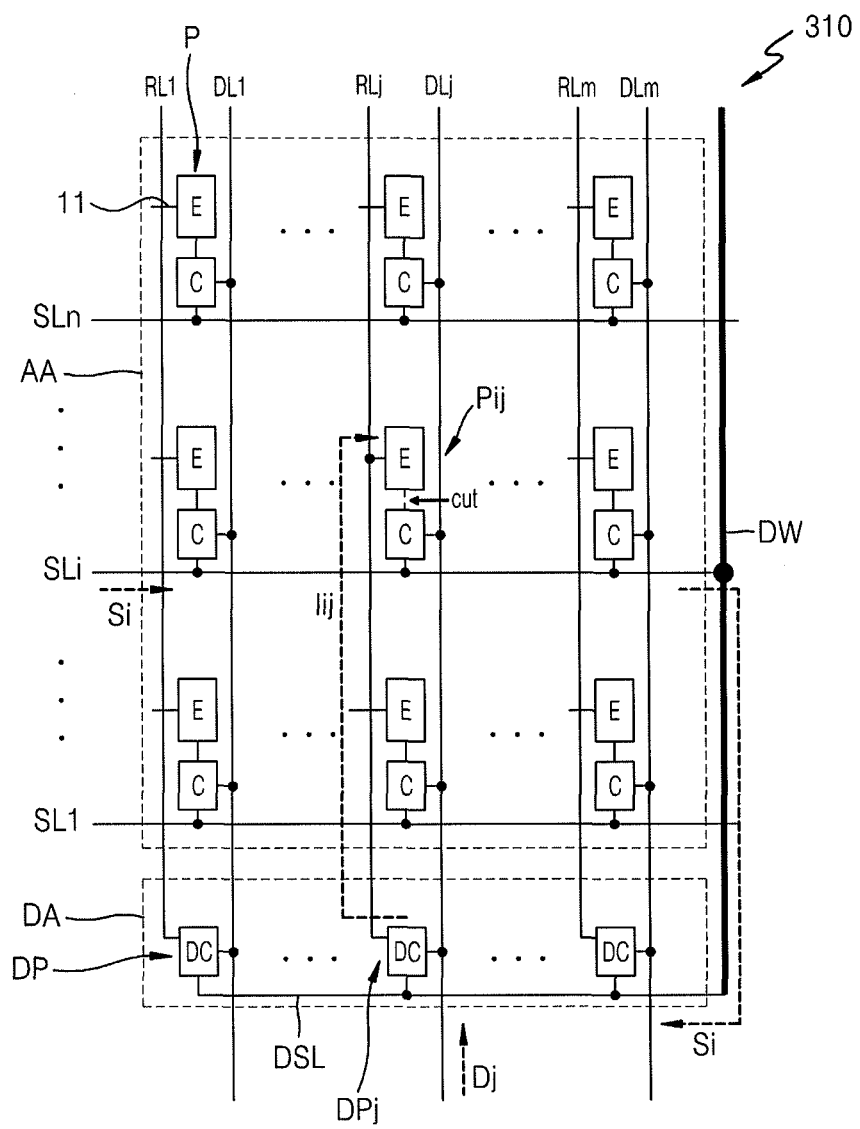
FIG. 13 illustrates an embodiment of a method for repairing a defective pixel in FIG. 12.

FIG. 13 illustrates an embodiment of a method for repairing a defective pixel using the repair lines RL1-RLm in the display panel of FIG. 12. In FIG. 13, an example is described in which the pixel Pij, which is connected to the i-th scan line SLi and the j-th data line DLj, is defective among the pixels P in the active area AA. Also, in this example, the pixel circuit C of the pixel Pij is defective, and the pixel Pij is referred to as the defective pixel Pij.

Referring to FIG. 13, first, the light emitting device E of the defective pixel Pij is separated from the pixel circuit C. For example, a laser may be irradiated onto a region in which the light emitting device E and the pixel circuit C are connected, in order to cut the region. Then, the light emitting device E of the defective pixel Pij may be separated from the pixel circuit C.

Next, the light emitting device E of the defective pixel Pij and the dummy pixel circuit DC of a dummy pixel DPj are electrically connected to each other. By using a laser, the light emitting device E of the defective pixel Pij is connected to a repair line RLj in the same column. Because the repair line RLj is connected to the dummy pixel circuit DC, the light emitting device E of the defective pixel Pij is connected to the dummy pixel circuit DC of the dummy pixel DPj.

Next, the scan line SLi, which is connected to the defective pixel Pij, and the dummy scan line DSL are electrically connected to each other. For example, the scan line SLi is connected to the dummy wiring DW using a laser. The scan line SLi is electrically connected to the dummy scan line DSL via the dummy wiring DW.

The pixel circuit C of the defective pixel Pij and the dummy pixel circuit DC of the dummy pixel DPj are connected to each other via the scan line SLi, the dummy wiring DW, and the dummy scan line DSL. Therefore, the scan signal Si applied to the pixel circuit C of the defective pixel Pij is applied to the dummy pixel circuit DC of the dummy pixel DPj. Because the pixel circuit C of the defective pixel Pij and the dummy pixel circuit DC of the dummy pixel DPj are both connected to the data line DLj, both receive the data signal Dj.

The dummy pixel circuit DC responds to the scan signal Si and receives the data signal Dj, and then generates the driving current Iij that corresponds to the data signal Dj. The dummy pixel circuit DC provides the driving current Iij to the light emitting device E of the defective pixel Pij via the repair line RLi. The light emitting device E of the defective pixel Pij emits light having a brightness level that corresponds to the data signal Dj based on the driving current Iij. Thus, the defective pixel Pij may be repaired and be a normal pixel.

According to the present embodiment, because the dummy scan line DSL is connected to the scan line SLi via the dummy wiring DW, it is not necessary to separately drive the dummy scan line DSL. Therefore, separate timing circuit or signals are not required. Also, the scan driver does not have to be modified to drive the dummy scan line DSL. Also, it is possible to continue using the data driver and the scan driver that are being used.

When a plurality of pixels P of the same row are defective, the defective pixels may be repaired using the dummy pixels DP that are respectively disposed in the same row as a row of each of the defective pixels.

Figure 14:
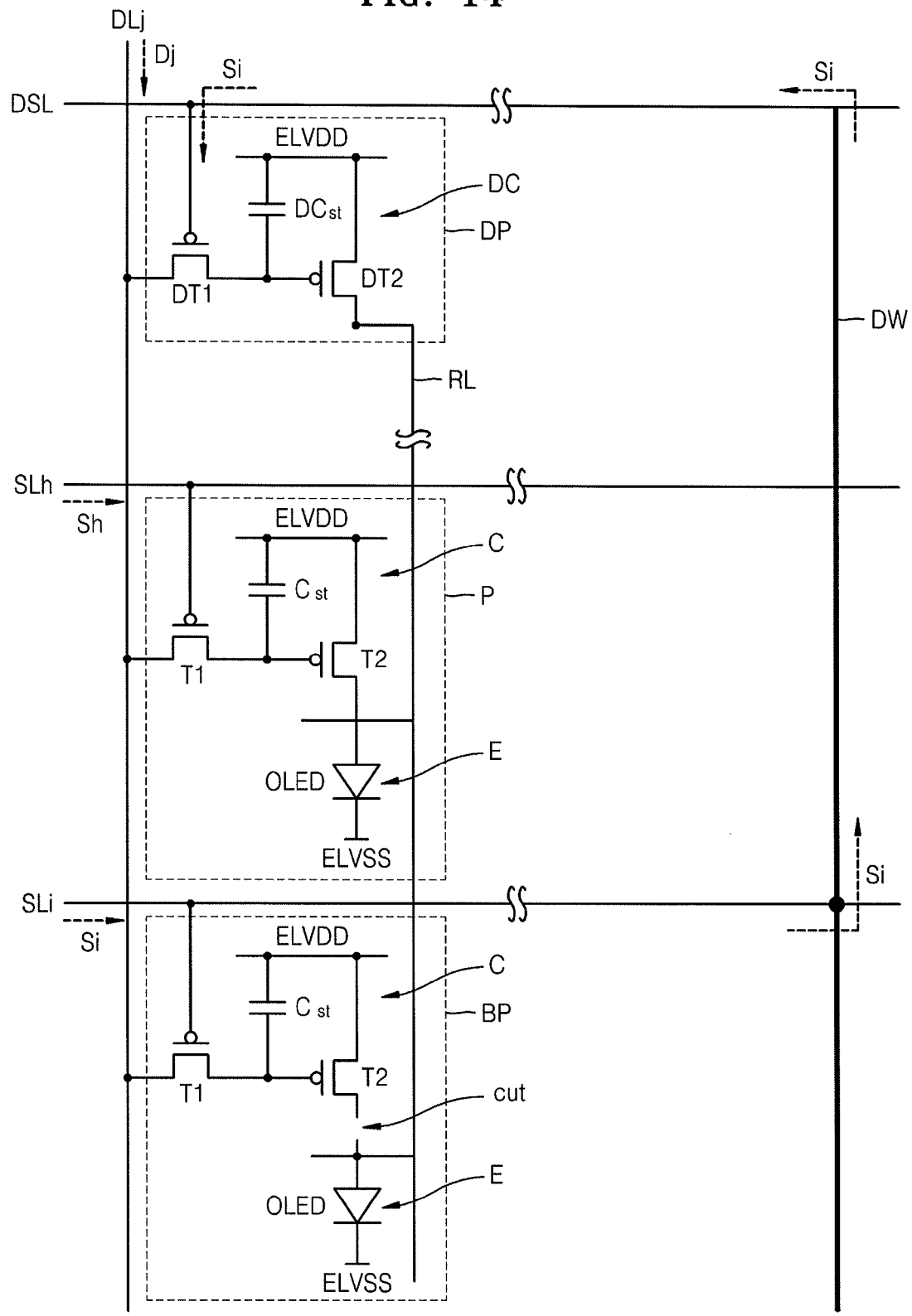
FIG. 14 illustrates a circuit diagram of a dummy pixel, a pixel, and a defective pixel that is repaired according to another embodiment.

FIG. 14 illustrates a circuit diagram of the dummy pixel DP, the pixel P, and the defective pixel BP that is repaired according to one embodiment.

The dummy pixel DP is disposed in the same column as the pixel P, and only includes the dummy pixel circuit DC, without the light emitting device.

The dummy pixel circuit DC includes the first dummy transistor DT1 connected to the data line DLj and the dummy scan line DSL, the second dummy transistor DT2 connected between the first power voltage source ELVDD and the first dummy transistor DT1, and the dummy capacitor DCst connected between the first power voltage source ELVDD and the first dummy transistor DT1. The dummy pixel circuit DC may have a different structure in other embodiments. For example, the dummy pixel circuit DC may omit the capacitor or may have one or more TFTs and capacitors.

The dummy scan line DSL is connected to the dummy wiring DW. The dummy wiring DW is connectable to scan lines SLh and SLi.

The light emitting device E of the defective pixel BP is separated from the pixel circuit C of the defective pixel BP, for example, by laser-cutting. The light emitting device E of the defective pixel BP is connected to the repair line RLj using a laser or another technique. Accordingly, the light emitting device E of the defective pixel BP is connected to the dummy pixel circuit DC. Also, the scan line SLi, which is connected to the pixel circuit C of the defective pixel BP, is connected to the dummy wiring DW by a laser or another technique.

The dummy pixel circuit DC and the pixel circuit C of the defective pixel BP simultaneously receive the same scan signal Si and the same data signal Dj. The dummy pixel circuit DC generates the driving current Iij that corresponds to the data signal Dj, and provides the driving current Iij to the light emitting device E of the defective pixel BP via the repair line RL. The light emitting device E of the defective pixel BP emits light having a level of brightness that corresponds to the data signal Dj based on the driving current Iij. Thus, the defective pixel BP may be repaired and operate as a normal pixel.

According to the one or more of the aforementioned embodiments, a defective pixel may be repaired using a dummy pixel without replacing, changing, or otherwise modifying an existing display driver. In addition, a difference between respective charging times of a capacitor of a repaired pixel and a capacitor of a normal pixel (e.g., one that is not repaired) may be reduced. Thus, the likelihood that vertical lines will appear on a display screen may be reduced. Also, in accordance with one or more of the aforementioned embodiments, it is possible to separately determine whether or not a dummy capacitor is defective.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
    a plurality of pixels arrayed in a first direction and a second direction in an active area;
    a plurality of dummy pixels arrayed in the second direction in a dummy area, each of the dummy pixels including a capacitor to store a voltage based on a data signal;
    a plurality of first lines which extend in the first direction and are connected to the pixels and the dummy pixels;
    a plurality of repair lines, which extend in the first direction, are connected to the dummy pixels and are selectively connected to the pixels;
    a plurality of second lines which extend in the second direction and are connected to the pixels;
    at least one dummy line which extends in the second direction and is connected to the dummy pixels; and
    at least one dummy wiring which extends in the first direction, is connected to the at least one dummy line, and is selectively connected to one of the second lines.

2. The display apparatus as claimed in claim 1, wherein each of the pixels includes a light emitting device and a pixel circuit that is separably connected to the light emitting device.

3. The display apparatus as claimed in claim 2, wherein:
    when at least one of the pixels is defective, a light emitting device of the at least one defective pixel is connected to a corresponding one of the dummy pixels via a corresponding one of the repair lines, and is electrically separated from a pixel circuit of the at least one defective pixel.

4. The display apparatus as claimed in claim 3, wherein one of the second lines connected to the at least one defective pixel is connected to the at least one dummy wiring.

5. The display apparatus as claimed in claim 2, wherein the pixel circuit includes:
    a first transistor to transfer a data signal in response to a scan signal;
    a capacitor to charge a voltage that corresponds to the data signal; and
    a second transistor to transfer driving current, that corresponds to the voltage charged in the capacitor, to the light emitting device.

6. The display apparatus as claimed in claim 5, wherein:
    each of the first lines is a scan line that transfers the scan signal to the pixel circuit, and
    each of the plurality of second lines is a data line that transfers a corresponding data signal to the pixel circuit.

7. The display apparatus as claimed in claim 5, wherein:
    each of the first lines is a data line that transfers a corresponding data signal to the pixel circuit, and
    each of the second lines is a scan line that transfers the scan signal to the pixel circuit.

8. The display apparatus as claimed in claim 1, wherein the at least one dummy wiring is in an outer region of the active area and the dummy area.

9. The display apparatus as claimed in claim 1, wherein the at least one dummy wiring includes a material with lower resistivity than a material of the first lines and a material of the second lines.

10. The display apparatus as claimed in claim 1, further comprising:
    a plurality of compensation capacitors connected to respective ones of the second lines.

11. The display apparatus as claimed in claim 10, wherein:
    when at least one of the pixels is defective, a second line connected to the at least one defective pixel is electrically separated from a corresponding one of the compensation capacitors.

12. The display apparatus as claimed in claim 10, wherein the compensation capacitors include a plurality of first electrodes connected to respective ones of the second lines and a plurality of second electrodes that are commonly connected, the second electrodes connected to an external terminal through which an external signal is to be input.

13. The display apparatus as claimed in claim 1, wherein:
    the dummy area includes a first dummy area and a second dummy area,
    the active area is between the first and second dummy areas and includes a first active area adjacent the first dummy area and a second active area adjacent the second dummy area,
    the repair lines include first repair lines connected to respective ones of the dummy pixels in the first dummy area and second repair lines connected to respective ones of the dummy pixels in the second dummy area,
    the at least one dummy line includes at least one first dummy line connected to the dummy pixels in the first dummy area and at least one second dummy line connected to the dummy pixels in the second dummy area, and
    the at least one dummy wiring includes at least one first dummy wiring connected to the at least one first dummy line and at least one second dummy wiring connected to the at least one second dummy line.

14. The display apparatus as claimed in claim 13, wherein:
    when the pixels include a first defective pixel in the first active area, the first defective pixel is connected to a corresponding one of the dummy pixels in the first dummy area via a corresponding first repair line, and a second line connected to the first defective pixel is connected to the at least one first dummy wiring, and wherein the pixels include a second defective pixel in the second active area, the second defective pixel is connected to a corresponding one of the dummy pixels in the second dummy area via a corresponding second repair line, and a second line connected to the second defective pixel is connected to the at least one second dummy wiring.

15. The display apparatus as claimed in claim 1, wherein:
the dummy area includes a first sub-dummy area and a second dummy area that are arrayed in the second direction,
the at least one dummy line includes a first dummy line to which dummy pixels in the first sub-dummy area are connected and a second dummy line to which dummy pixels in the second sub-dummy area are connected, and
the at least one dummy wiring includes a first dummy wiring to which the first dummy line is connected and a second dummy wiring to which the second dummy line is connected.

16. The display apparatus as claimed in claim 1, further comprising:
a first driver to drive the plurality of first lines; and
a second driver to drive the plurality of second lines.

17. The display apparatus as claimed in claim 16, wherein the second driver drives the at least one dummy line via a second line connected to the at least one dummy wiring from among the plurality of second lines.

18. An organic light-emitting display apparatus, comprising:
a plurality of pixels arrayed in a first direction and a second direction in an active area;
a plurality of dummy pixels arrayed in the second direction in a dummy area;
a plurality of active lines which extend in the second direction and are connected to the pixels;
a plurality of dummy lines which extend in the second direction and are selectively connected to the dummy pixels; and
a plurality of dummy wirings which extend in the first direction, and are respectively connected to the dummy lines, and are selectively connected to respective ones of the active lines, wherein each of the dummy pixels includes a capacitor to store a voltage based on a data signal.

19. An organic light-emitting display apparatus, comprising:
an active area including an array of pixels, each of the pixels including a first light emitting device and a first pixel circuit that is separably connected to the first light emitting device;
a repaired pixel including a second light emitting device, and a second pixel circuit that is electrically separated from the second light emitting device;
a dummy pixel including a dummy pixel circuit connected to the second light emitting device, the dummy pixel circuit including a capacitor to store a voltage based on a data signal;
a first line connected to the second pixel circuit and the dummy pixel circuit; and
a dummy wiring that connects a dummy line, which is connected to the dummy pixel circuit, to a second line connected to the second pixel circuit in an outer region of the active area.

20. The display apparatus as claimed in claim 19, wherein:
a first signal, which is transferred to the second pixel circuit, is input to the dummy pixel circuit via the first line, and
a second signal, which is transferred to the second pixel circuit, is input the dummy pixel circuit via the second line, the dummy wiring, and the dummy line.

* * * * *